(12) United States Patent  
Matsunaka et al.

(10) Patent No.: US 12,365,976 B2  
(45) Date of Patent: Jul. 22, 2025

(54) FILM FORMING APPARATUS

(71) Applicant: SHIBAURA MECHATRONICS CORPORATION, Yokohama (JP)

(72) Inventors: Shigeki Matsunaka, Yokohama (JP); Ivan Petrov Ganachev, Hiratsuka (JP); Yoji Takizawa, Yokohama (JP); Hiroshi Ootsuka, Yokohama (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 18/612,641

(22) Filed: Mar. 21, 2024

(65) Prior Publication Data

US 2024/0321563 A1    Sep. 26, 2024

(30) Foreign Application Priority Data

Mar. 22, 2023 (JP) ................................ 2023-045751  
Jan. 18, 2024 (JP) ................................ 2024-006287  
Mar. 21, 2024 (JP) ................................ 2024-044726

(51) Int. Cl.  
*C23C 14/00* (2006.01)  
*C23C 14/06* (2006.01)  
(Continued)

(52) U.S. Cl.  
CPC ...... *C23C 14/0063* (2013.01); *C23C 14/0078* (2013.01); *C23C 14/0617* (2013.01); *C23C 14/34* (2013.01); *C23C 14/505* (2013.01); *C23C 14/568* (2013.01); *H01J 37/32715* (2013.01); *H01J 37/32752* (2013.01); *H01J 37/32834* (2013.01); *H01J 37/3426* (2013.01)

(58) Field of Classification Search  
CPC ............ C23C 14/0063; C23C 14/0078; C23C 14/568; C23C 14/0617; C23C 14/34; C23C 14/505; C23C 14/354; C23C 14/0641; C23C 14/228; C23C 16/4412; H01J 37/3426; H01J 37/32834; H01J 37/32715; H01J 37/32752; H01J 37/32899; H01J 37/32651  
See application file for complete search history.

(56) References Cited

U.S. PATENT DOCUMENTS 4,420,385 A * 12/1983 Hartsough .......... C23C 14/5846  
                                                              204/192.15  
6,287,430 B1 * 9/2001 Matsumoto ........... C23C 14/568  
                                                              204/192.16

FOREIGN PATENT DOCUMENTS

JP           2018-3152 A       1/2018

* cited by examiner

*Primary Examiner* — Michael A Band  
(74) *Attorney, Agent, or Firm* — Sughrue Mion, PLLC

(57) ABSTRACT

A film forming apparatus includes: a rotary table provided in a chamber; a processing unit configured to perform plasma processing on a workpiece transferred by the rotary table; an inner wall configured to define a processing space and having an opening facing the rotary table; an outer wall configured to cover a periphery of the inner wall with a gap, and configured to form an exhaust space having an opening facing the rotary table; and an exhaust port connected to an exhaust device, wherein the processing unit is a film forming part configured to form a film by sputtering, and wherein both ends of the outer wall are in contact with a side surface of the chamber, and a portion of an outer periphery of the inner wall and the side surface of the chamber are partitioned, so that a reaction gas does not circulate in the exhaust space.

11 Claims, 25 Drawing Sheets

(51) Int. Cl.
*C23C 14/34* (2006.01)
*C23C 14/50* (2006.01)
*C23C 14/56* (2006.01)
*H01J 37/32* (2006.01)
*H01J 37/34* (2006.01)

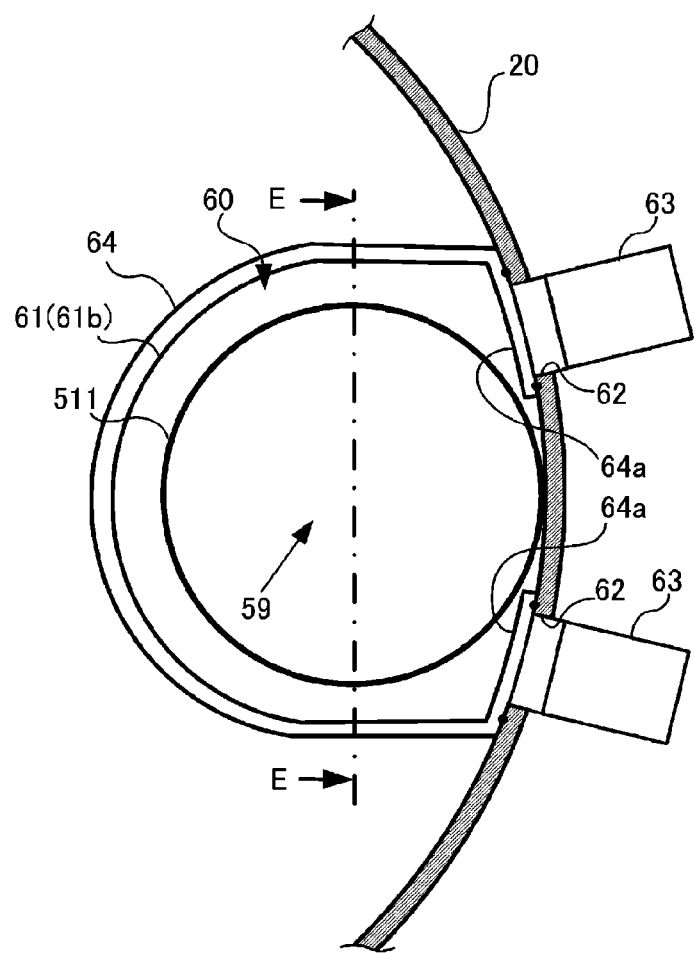

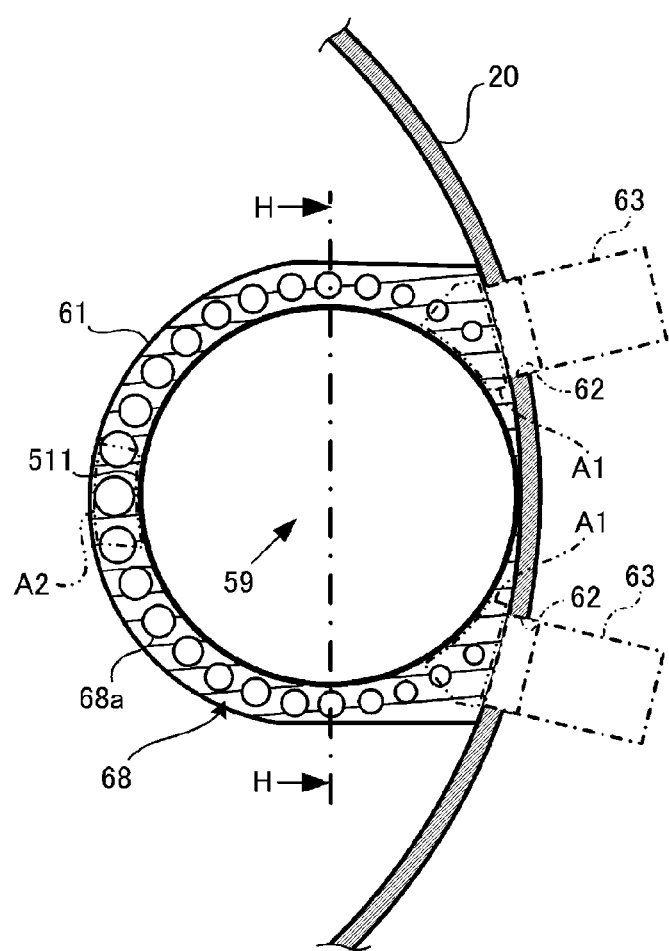

FILM FORMING APPARATUS

CROSS-REFERENCE TO RELATED APPLICATIONS

This application is based upon and claims the benefit of priority from Japanese Patent Application No. 2023-045751, filed on Mar. 22, 2023, Japanese Patent Application No. 2024-006287, filed on Jan. 18, 2024, and Japanese Patent Application No. 2024-044726, filed on Mar. 21, 2024, the entire contents of which are incorporated herein by reference.

TECHNICAL FIELD

The present disclosure relates to a film forming apparatus.

BACKGROUND

In a manufacturing process of various products such as semiconductors, displays, and optical disks, a thin film such as a protective film, a conductive film, a functional film, and an optical film may be formed on a workpiece such as a wafer or a glass substrate. The thin film can be created by repeating film formation of forming a film of metal or the like on the workpiece, and performing film processing such as etching, oxidation, or nitridation on the formed film.

The film formation and the film processing may be performed by using various methods, one of which is a method using plasma processing. In the film formation, for example, a sputtering gas is introduced into a chamber, which is a vacuum container and in which a target made of a material to form a film is placed, and a voltage is applied to the target. The film formation is performed by causing sputtering gas ions, which are generated when the sputtering gas is ionized and plasmarized, to collide against the target such that the material ejected from the target is deposited onto a workpiece. In the film processing, a process gas is introduced into the chamber in which electrodes are placed, and a voltage is applied to the electrodes. The film processing is performed by causing ions of the plasmarized process gas to collide against the film on the workpiece.

In order to perform the film formation and the film processing (hereinafter, referred to as "plasma processing" including both the film formation and the film processing) continuously, there is a film forming apparatus in which a rotary table is installed inside one chamber, a plurality of film forming parts and film processing parts are disposed on a ceiling of the chamber, that is, above the rotary table, in a circumferential direction. With such a configuration, various films can be formed by holding and transferring a workpiece on the rotary table and causing the workpiece to pass directly below the film forming parts and the film processing parts.

SUMMARY

The film forming apparatus described above has a processing room, which is a space in which plasma processing is performed, inside the chamber. A portion of the processing room is configured, for example, by surrounding a processing region in a cylindrical shape by a shield member (inner wall) extending from the ceiling of the chamber toward the rotary table. The shield member is provided to prevent a film formation material from scattering from a target and adhering to the inner wall of the chamber, and prevent an introduced sputtering gas and process gas (hereinafter, referred to as "reaction gas" including both the sputtering gas and process gas) from flowing out from the processing room.

The shield member has an opening on a side opposite to the ceiling of the chamber, and an edge of the shield member is disposed close to the workpiece held on the rotary table with a gap in order to allow passage of the workpiece. For example, a gap of approximately several millimeters is formed between the edge of the shield member and the workpiece.

However, due to the gap, and a flow of the reaction gas between the inside and outside of the shield member which is caused by rotation of the rotary table and movement of the transferred workpiece, leakage of the reaction gas cannot be completely prevented.

In addition, in some cases, a plurality of processing rooms may be provided in order to improve a film deposition rate, which is an amount of film deposited per unit time, or to perform plasma processing with multiple types of materials. When the plurality of processing rooms exists as described above, pressure differences exists among the plurality of processing rooms. Therefore, between adjacent processing rooms, a reaction gas from one processing room flows into the other processing room, or a reaction gas from the other processing room flows into the one processing room, so that the reaction gases are mixed. When such mixing occurs, in-plane uniformity of a material of a film to be formed may be degraded.

The reaction gas, which leaks into the chamber from a processing room, spreads further away from the processing room and is easily mixed into another processing room. However, even when trying to exhaust the reaction gas, since a space inside the chamber other than the processing rooms has a shape, which makes it difficult to perform exhaust smoothly, or spreads over a wide area, it is necessary to provide a large number of exhaust locations or to expand an exhaust area, making it difficult to achieve efficient exhaust.

Embodiments of the present disclosure have been proposed to solve the above-mentioned problems, and to suppress mixing of reaction gases between processing parts.

According to one embodiment of the present disclosure, a film forming apparatus includes: a chamber having an interior capable of being evacuated; a rotary table provided in the chamber and configured to rotate to circulate and transfer a workpiece along a circumferential transfer path; a plurality of processing units configured to perform plasma processing on the workpiece transferred by the rotary table by plasmarizing a reaction gas introduced into the processing units; an inner wall provided in at least one of the processing units to define a processing space, into which the reaction gas is introduced to perform the plasma processing in the processing space, and having an opening facing the rotary table in a non-contact manner; an outer wall configured to cover a periphery of the inner wall with a gap interposed between the inner wall and the outer wall, and configured to form an opening facing the rotary table in a non-contact manner and an exhaust space that is closed on a side opposite to the opening in the outer wall; and an exhaust port in communication with the exhaust space and connected to an exhaust device configured to suction the reaction gas leaking from a gap between the opening in the inner wall and the rotary table and exhaust the reaction gas to an outside of the chamber, wherein one or more of the processing units is at least one film forming part configured to form a film by depositing a film formation material on the workpiece by sputtering, and wherein both ends of the outer wall are in contact with a side surface of the chamber, and a portion of an outer periphery of the inner wall and the side surface of the chamber are partitioned, so that the exhaust space has opposite ends via which the reaction gas does not circulate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4A is a transparent plan view and FIG. 4B is a cross-sectional view taken along line D-D in FIG. 4A.

FIGS. 6A and 6B schematically illustrate a modification of the embodiment, where FIG. 6A is a transparent plan view and FIG. 6B is a cross-sectional view taken along line E-E in FIG. 6A.

FIG. 7A is a transparent plan view illustrating an aspect of FIG. 4A and FIG. 7B is a transparent plan view illustrating an aspect of FIG. 6A.

FIG. 10A is a transparent plan view and FIG. 10B is a cross-sectional view taken along line F-F in FIG. 10A.

FIGS. 11A and 11B illustrate a nitriding part according to a modification in which a mask is provided at an opening of an exhaust space, where FIG. 11A is a transparent plan view and FIG. 11B is a cross-sectional view taken along line H-H in FIG. 11A.

FIG. 13A is a transparent plan view illustrating an aspect of FIG. 4A and FIG. 13B is a perspective view illustrating the inner wall, the outer wall, and partition plates.

FIG. 15A is a transparent plan view illustrating an aspect of FIG. 4A with one partition plate being provided, and FIG. 15B is a transparent plan view illustrating an aspect of FIG. 4A with a plurality of partition plates being provided.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. It should be noted that the drawings are schematic views and sizes, proportions, and the like of respective components may include parts that are exaggerated for ease of understanding.

[Overview]

Figure 1:
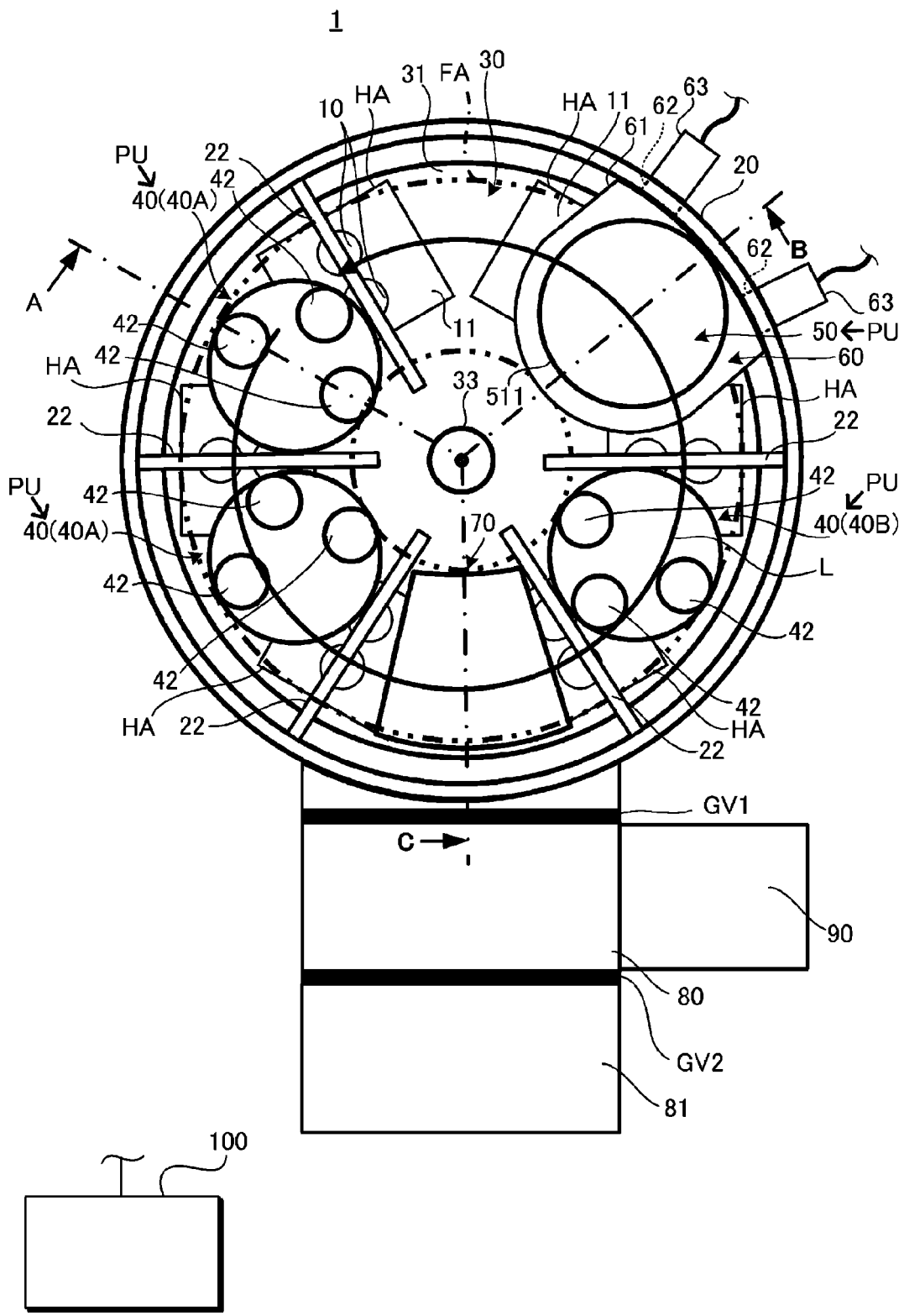
FIG. 1 is a perspective plan view schematically illustrating a configuration of a film forming apparatus according to an embodiment.
Figure 2:
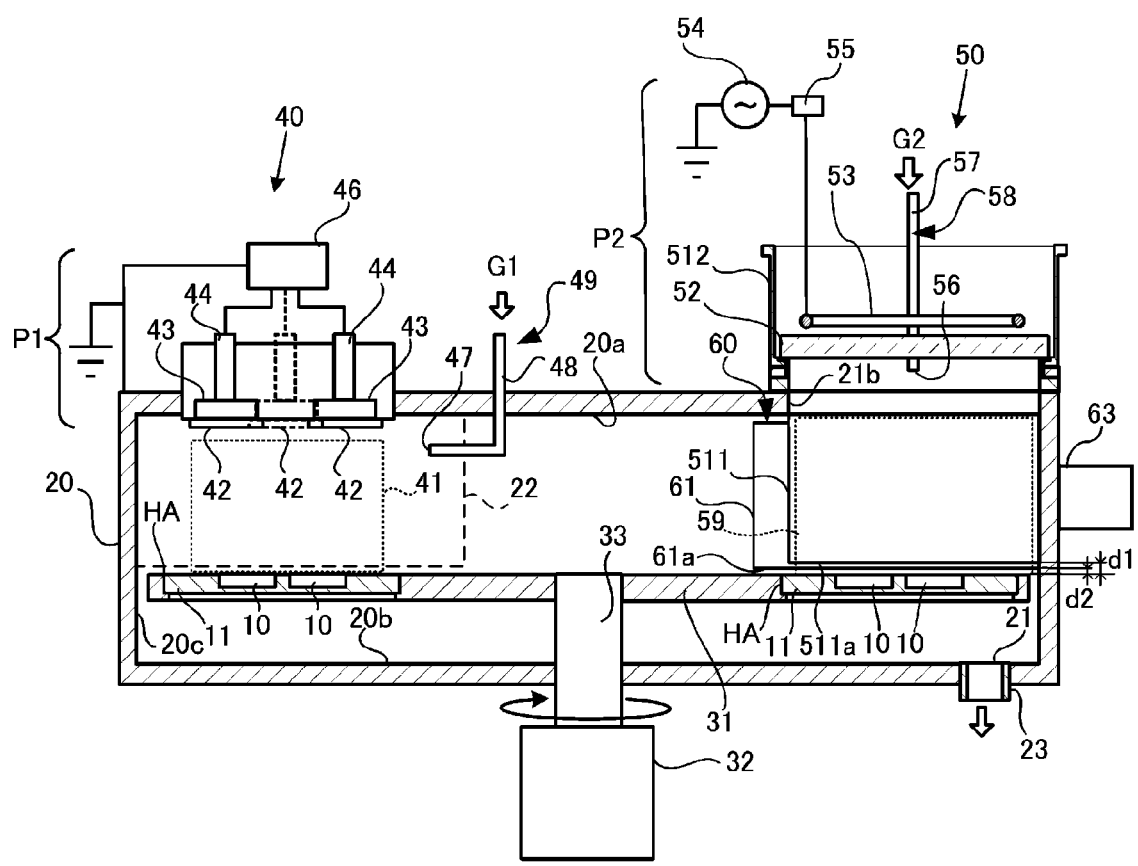
FIG. 2 is a cross-sectional view taken along line A-B in FIG. 1 and illustrates an internal configuration viewed from a side of the film forming apparatus.
Figure 3:
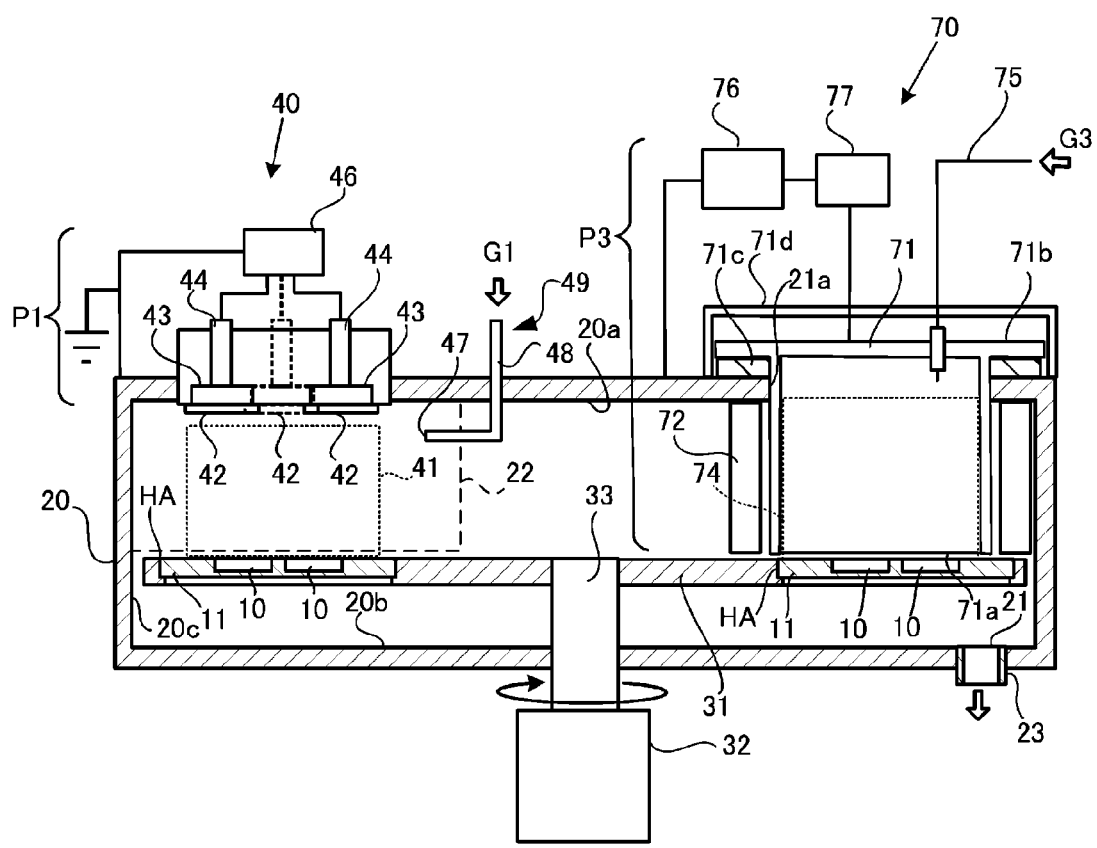
FIG. 3 is a cross-sectional view taken along line A-C in FIG. 1 and illustrates an internal configuration viewed from a side of the film forming apparatus.

A film forming apparatus 1 illustrated in FIGS. 1 to 3 includes a plurality of processing units PUs each configured to plasmarize a reaction gas introduced into the processing unit and perform plasma processing on a workpiece 10 transferred thereto by a rotary table 31. At least one processing unit PU is a film forming part 40 configured to form a film by depositing a film formation material on the workpiece 10 by sputtering. In the present embodiment, an example will be represented in which a gallium nitride (GaN) film is formed on the workpiece 10 by the film forming apparatus 1. Therefore, the film forming part 40 forms a GaN film on the workpiece 10, which is a film formation target, by sputtering. In addition, the film forming apparatus 1 includes, as the processing unit PU, a nitriding part 50 configured to nitride the film formed on the workpiece 10 by plasma processing. In the present embodiment, a double-walled exhaust space 60 is formed in the nitriding part 50 by covering an inner wall 511 defining a processing space 59 with an outer wall 61. The double-walled exhaust space 60 may also be defined in the film forming part 40 by covering a processing space 41 in the film forming part 40 with the inner wall 511 and the outer wall 61. In the following description, the reaction gas used in the film forming part 40 will be referred to as a sputtering gas G1, and the reaction gas used in the nitriding part 50 will be referred to as a process gas G2.

The workpiece 10 as a film formation target is, for example, a silicon (Si) wafer, a silicon carbide (SiC) wafer, a sapphire substrate, a glass substrate, or the like. The workpiece 10 is placed on a tray 11 and transferred. The tray 11 is a plate body held on the rotary table 31.

The film forming apparatus 1 includes a chamber 20, a transfer part 30, film forming parts 40, the nitriding part 50, the exhaust space 60, a surface processing part 70, a transfer room 80, a cooling room 90, and a control device 100. The chamber 20 is a container having an interior capable of being evacuated. The chamber 20 has a columnar shape, and the interior of the chamber is divided into a plurality of sections. The film forming parts 40 are disposed in three fan-shaped sections, which are partitioned by partitions 22. The nitriding part 50 and the surface processing part 70 are disposed in sections other than the sections where the film forming parts 40 are disposed.

Each film forming part 40 includes a plasma generator P1 configured to plasmarize the sputtering gas G1 introduced into a space between targets 42 made of a film formation material containing GaN and the rotary table 31, and forms a film by depositing particles of the film formation material on the workpiece 10, which is circulated and transferred by the rotary table 31, by sputtering.

The nitriding part 50 includes the processing space 59 surrounded by the inner wall 511, which is not in contact with the rotary table 31, and a plasma generator P2 configured to plasmarize the process gas G2 containing nitrogen (N2) introduced into the processing space 59. The nitriding part 50 nitrides the particles of the film formation material deposited by the film forming parts 40 on the workpiece 10, which is circulated and transferred by the rotary table 31.

As the workpiece 10 revolves inside the chamber 20 multiple times in a circumferential direction, the workpiece 10 alternately and itinerantly passes through the film forming parts 40 and the nitriding part 50. Thus, since formation of a GaN film on the workpiece 10 and nitridation of non-nitrided Ga in the GaN film are alternately repeated, a GaN film with a desired thickness grows.

In addition, the reason why a material containing GaN is used as the targets 42 and the nitriding part 50 is further provided to nitride Ga in the formed GaN film is as follows. Since Ga has a low melting point and is in a liquid state at normal temperature and normal pressure, in order to obtain the target 42 in a solid state, it is necessary for the target 42 to contain nitrogen.

Here, DC discharge sputtering may improve a film formation rate than RF discharge sputtering. However, when the target 42 contains a large amount of nitrogen, a surface of the target 42 acts as an insulator, and in the target 42 having the surface acting as an insulator as described above, DC discharge may not occur.

In other words, when DC discharge sputtering is adopted in consideration of the film formation rate, there will be a limit to the amount of nitrogen that can be contained in the target 42 of GaN. Therefore, nitridation of Ga in the target 42 remains insufficient, and the target 42 containing GaN contains Ga atoms having no bonds with nitrogen (N) atoms.

When a GaN film is formed by using such a target 42, the formed GaN film has a low nitrogen content and nitrogen defects (non-nitrided state) are present in the formed GaN film, so that crystallinity of the film deteriorates and flatness of the film is degraded. Thus, it is necessary to supplement insufficient nitrogen. In this regard, it is conceivable to perform sputtering by adding nitrogen gas to the sputtering gas introduced into the film forming parts 40, but the surfaces of the targets 42 would be nitrided and act as an insulator. Therefore, nitrogen gas for supplementing the insufficient nitrogen cannot be added to the sputtering gas in the film forming parts 40.

Accordingly, in the present embodiment, in order to compensate for the insufficient nitrogen in the GaN film formed by the film forming parts 40, a nitriding process is further performed in the nitriding part 50 after the GaN film is formed by the film forming parts 40. By performing the nitriding process during film formation as described above, it is possible to increase a nitrogen content in a film formed on the workpiece 10 and form a GaN film without nitrogen defects.

[Chamber]

As illustrated in FIG. 2, the chamber 20 is a container having an interior capable of being evacuated. The chamber 20 has a columnar shape, and the interior of the chamber is divided into a plurality of sections. The chamber 20 is surrounded by a disk-shaped ceiling surface 20a, a disk-shaped bottom surface 20b, and an annular side surface 20c. The partitions 22 are rectangular wall plates disposed radially from a center of the columnar shape, and extend from the ceiling surface 20a toward the bottom surface 20b, but do not reach the bottom surface 20b. That is, a columnar space is secured on a side the bottom surface 20b.

The rotary table 31 configured to transfer the workpiece 10 is disposed in this columnar space. Lower ends of the partitions 22 face a placement surface for the workpiece 10 on the rotary table 31 with a gap through which the workpiece 10 placed on the rotary table 31 passes. The processing space 41 in which the workpiece 10 is processed by the film forming part 40 is partitioned by the partitions 22. That is, the film forming part 40 has the processing space 41 which is smaller than the chamber 20. The partitions 22 suppress the sputtering gas G1 of the film forming part 40 from diffusing into the chamber 20. In the film forming parts 40, since it is necessary to adjust a pressure in the processing space 41, which are partitioned to be smaller than the chamber 20, pressure adjustment can be easily performed, and plasma discharge can be stabilized.

In addition, an exhaust port 21 is provided in the chamber 20. An exhauster 23 is connected to the exhaust port 21. The exhauster 23 has a pipe, a pump and valve (not illustrated), and the like. By exhausting via the exhaust port 21 by the exhauster 23, the interior of the chamber 20 can be depressurized to be vacuum. The exhauster 23 performs exhaust until a degree of vacuum reaches, for example, $10^{-4}$ Pa in order to suppress an oxygen concentration to be low.

[Transfer Part]

The transfer part 30 has the rotary table 31 and a motor 32. The rotary table 31 is provided in the chamber 20 and rotates to circularly transfer the workpiece 10 along a circular transfer path L. The rotary table 31 of the present embodiment holds and transfers a plurality of workpieces 10. The rotary table 31 is a disk-shaped member disposed inside the chamber 20, and extends widely to the extent that the rotary table 31 is not in contact with an inner side of the side surface 20c.

The rotary table 31 is supported by a rotary shaft 33 coaxial with a center of the circle via a fastening member. The rotary shaft 33 passes through the bottom surface 20b of the chamber 20 in an airtight manner and protrudes to the outside. The motor 32 is disposed outside the chamber 20 and rotates the rotary shaft 33 via a coupling member, thereby continuously rotating the rotary table 31 at a predetermined rotation speed. The rotary table 31 rotates at a speed of, for example, 1 to 150 rpm.

As illustrated in FIG. 1, a film formation area FA where a film is formed on the plurality of workpieces 10 is provided in the rotary table 31. As illustrated by the two-dot chain line in FIG. 1, the film formation area FA is an area other than the rotary shaft 33 of the rotary table 31 in a plan view, and is an annular area facing the film forming part 40 and the nitriding part 50. In the film formation area FA, holding areas HA in which individual workpieces 10 are held are provided at equal intervals in the circumferential direction.

In each holding area HA, a holding portion such as grooves, holes, protrusions, jigs, or holders is provided, and the tray 11 on which the workpiece 10 is placed is held by a mechanical chuck or an adhesive chuck. For example, a plurality of workpieces 10 is placed on the tray 11, and six holding areas HA are disposed on the rotary table 31 at intervals of 60 degrees. In other words, the film forming apparatus 1 can collectively form films on the plurality of workpieces 10 held in the plurality of holding areas HA, and therefore has very high productivity. In addition, the trays 11 may be omitted and the workpieces 10 may be directly held in the holding areas HA of the rotary table 31. In addition, although not illustrated, a heater that heats the workpiece 10 is provided in each holding area HA. As the heater, a heater that generates heat when energized or the like may be used. In addition, the trays 11 and the workpieces 10 in the holding areas HA are disposed such that top surfaces thereof are flush with a top surface of the rotary table 31.

[Film Forming Part]

The film forming part 40 generates plasma and exposes the target 42 made of a film formation material to the plasma. Thus, the film forming part 40 deposits particles (hereinafter, referred to as "sputtered particles") of the target 42, which are ejected by colliding ions contained in the plasma with the target 42, on the workpiece 10 to form a film. The film forming part 40 includes the plasma generator P1 configured to plasmarize the sputtering gas G1 introduced into the space between the target 42 made of a film formation material and the rotary table 31.

As illustrated in FIG. 2, the plasma generator P1 includes a sputter source, which includes the targets 42, backing plates 43, and electrodes 44, a power supply 46, and a sputtering gas introducer 49.

The targets 42 are plate-shaped members made of a film formation material that is deposited on the workpiece 10 to form a film. The targets 42 are distanced from the transfer path L of the workpiece 10 placed on the rotary table 31. Surfaces of the targets 42 are held on the ceiling surface 20a of the chamber 20 to face the workpiece 10 placed on the rotary table 31. One or more targets 42 are provided for one film forming part 40. In the present embodiment, three targets 42 are provided, and the three targets 42 are provided at positions arranged on vertices of a triangle in a plan view.

The backing plates 43 are support members that holds the targets 42. The targets 42 are held on the ceiling surface 20a of the chamber 20 via the backing plates 43. The backing plates 43 hold each target 42 individually. The electrodes 44 are conductive members for individually applying power to each target 42 from the outside of the chamber 20, and are electrically connected to the targets 42. The power applied to the respective targets 42 can be changed individually. In addition, the sputtering source is appropriately equipped with a magnet, a cooling mechanism, and the like, as necessary.

The power supply 46 is, for example, a DC power supply that generates a high voltage, and is electrically connected to the electrodes 44. The power supply 46 applies the generated power to the targets 42 via the electrodes 44. The rotary table 31 is at the same potential as the chamber 20, which is grounded, and by applying the high voltage to the targets 42, a potential difference is generated between the targets 42 and the rotary table 31.

The sputtering gas introducer 49 introduces the sputtering gas G1 into the chamber 20, as illustrated in FIG. 2. The sputtering gas introducer 49 has a source of the sputtering gas G1 such as a cylinder (not illustrated), a pipe 48, and a gas introduction port 47. The pipe 48 is connected to the source of the sputtering gas G1, passes through the chamber 20 in an airtight manner, and extends into the chamber 20. An end of the pipe 48 is open as the gas introduction port 47. The sputtering gas introducer 49 of the present embodiment introduces the sputtering gas G1 into the processing space 41 such that the pressure in the processing space 41 becomes, for example, 0.3 Pa or higher and 1.0 Pa or lower.

The gas introduction port 47 is open at a space between the rotary table 31 and the targets 42, and introduces the sputtering gas G1 for film formation into the processing space 41, which is formed between the rotary table 31 and the targets 42. A rare gas may be used as the sputtering gas G1, and the sputtering gas G1 may be argon (Ar) gas or the like. The sputtering gas G1 is a gas that does not contain nitrogen ($N_2$), and may be a single gas of argon (Ar). The rare gas does not react with the particles of the film formation material. For example, even when the sputtering gas G1 is the Ar single gas, the sputtering gas G1 is included in the reaction gas. In other words, a gas that indirectly contributes to reaction of other substances, such as a rare gas, is also included in the reaction gas, even when the gas does not itself react with other substances.

In the film forming part 40 as described above, when the sputtering gas G1 is introduced from the sputtering gas introducer 49 and the power supply 46 applies the high voltage to the targets 42 via the electrodes 44, the sputtering gas G1 introduced into the processing space 41 formed between the rotary table 31 and the targets 42 is plasmarized, and active species such as ions are generated. The ions in the plasma collide with the targets 42 and start to beat out sputtered particles.

In addition, the workpiece 10 that is circulated and transferred by the rotary table 31 passes through the processing space 41. The ejected sputtered particles are deposited on the workpiece 10 when the workpiece 10 passes through the processing space 41, and a film made of the sputtered particles is formed on the workpiece 10. The workpiece 10 is circulated and transferred by the rotary table 31 and repeatedly passes through the processing space 41, whereby a film forming process is performed. A thickness of the film deposited each time the film passes through the film forming part 40 varies according to a processing rate of the nitriding part 50, but the film may be a thin film on the order of, for example, 1 to 2 atoms (5 nm or less). By circulating and transferring the workpiece 10 multiple times, the thickness of the film increases, and a film having a predetermined thickness is formed on the workpiece 10.

In the present embodiment, the film forming apparatus 1 includes a plurality of (here, three) film forming parts 40, and one film forming part 40 is provided in each of the three sections partitioned by the partitions 22. The plurality of film forming parts 40 forms a film constituted by layers of a plurality of film formation materials, by selectively depositing the film formation materials. In particular, in the present embodiment, the film forming parts 40 include sputtering sources corresponding to different types of film formation materials, and selectively deposit the film formation materials to form a film constituted by layers of multiple types of film formation materials. Including sputtering sources corresponding to different types of film formation materials includes a case where the film formation materials of all the film forming parts 40 are different from one another, as well as a case where one film formation material is common to a plurality of film forming parts 40, but other film formation materials differ from the common film formation material. Selectively depositing the film formation materials one by one means that while the film forming part 40 for one film formation material forms a film, other film forming parts 40 for other film formation materials do not perform film formation.

In the present embodiment, the film formation material of the targets 42 of two film forming parts 40 is a material containing Ga and GaN, and the targets 42 serve as a source of sputtered particles containing Ga atoms to be deposited on the workpiece 10. The targets 42 contain GaN and incomplete GaN deficient in nitrogen, i.e., Ga atoms having no bonds with nitrogen (N).

The film formation material of the target 42 of one film forming part 40 is a material containing Al, and the target 42 serves as a source of sputtered particles containing Al atoms to be deposited on the workpiece 10. In addition, the target 42 for sputtering may contain substances other than Ga, Al, and nitrogen (N), as long as it can supply sputtered particles containing Ga atoms and sputtered particles containing Al atoms.

As illustrated in FIG. 1, in order to distinguish two types of film forming parts 40, two film forming parts 40 having targets 42 made of materials containing Ga and GaN will be referred to as film forming parts 40A (GaN film forming parts), and the film forming part 40 having targets 42 made of a material containing Al will be referred to as a film forming part 40B (an Al film forming part).

[Nitriding Part]

The nitriding part 50 generates inductively coupled plasma in the processing space 59 into which the process gas G2 containing nitrogen gas is introduced. That is, the nitriding part 50 plasmarizes nitrogen gas to generate chemical species. Nitrogen atoms contained in the generated chemical species collide with a film containing Ga atoms and a film containing Al atoms, which are formed on the workpiece 10 by the film forming parts 40, to bond with the Ga atoms, which do not have bonds with nitrogen, in the film containing the Ga atoms and with the Al atoms in the film containing the Al atoms. As a result, a GaN film or an AlN film without nitrogen defects can be obtained.

As illustrated in FIG. 2, the nitriding part 50 includes the plasma generator P2 that includes the inner wall 511, a cover 512, a window 52, an antenna 53, an RF power supply 54, a matching box 55, and a process gas introducer 58.

The inner wall 511 is a member that covers a periphery of the processing space 59. That is, the inner wall 511 is provided in the processing unit PU, partitions and defines the processing space 59 into which the process gas G2 is introduced and plasma processing is performed, and has an opening 511a facing the rotary table 31 in a non-contact manner. The inner wall 511 has a cylindrical shape as illustrated in FIGS. 1 and 2. One end of the inner wall 511 is fit into an opening 21b provided in the ceiling surface 20a of the chamber 20. The inner wall 511 protrudes into an internal space of the chamber 20 such that an opening 511a at the other end of the inner wall 511 faces the rotary table 31. However, the inner wall 511 is not in contact with the rotary table 31. In addition, the inner wall 511 is in contact with the side surface 20c of the chamber 20. Thus, a space around an outer periphery of the inner wall 511 is partitioned by the side surface 20c of the chamber 20. In addition, the inner wall 511 and the side surface 20c are not necessarily in direct contact with each other, and a partition member may be interposed between the outer periphery of the inner wall 511 and the side surface 20c of the chamber 20 to partition the space around the outer periphery of the inner wall 511.

The cover 512 is a cylindrical member. One end of the cover 512 is installed to be aligned with the opening 21b of the chamber 20 so that the cover 512 protrudes outward and upward from the ceiling surface 20a of the chamber 20. The window 52 is a flat plate made of a dielectric material such as quartz and has a shape substantially similar to a horizontal cross section of the cover 512. The window 52 is provided inside the cover 512 so as to close the opening 21b, and partitions an interior of the cover 512 from the processing space 59 in the chamber 20 into which the process gas G2 containing nitrogen gas is introduced. At this time, it is necessary to suppress oxidation caused by oxygen flowing into the processing space 59. For example, a required oxygen concentration is $10^{19}$ atoms/cm$^3$ or less, which is very low. In order to deal with this, a surface of the window 52 is coated. For example, by coating the surface of the window 52 with yttrium oxide ($Y_2O_3$), it is possible to suppress release of oxygen from the surface of the window 52 while suppressing consumption of the window 52 due to plasma, thereby maintaining the oxygen concentration to be low.

The processing space 59 is formed in the nitriding part 50 by being surrounded by the rotary table 31 and the inner wall 511. The workpiece 10, which is circulated and transferred by the rotary table 31, repeatedly pass through the processing space 59, whereby a nitriding process is performed.

The antenna 53 is a conductor wound in a coil shape, and is disposed in an internal space of the cover 512, which is isolated from the processing space 59 in the chamber 20 by the window 52. The antenna 53 generates an electric field when an alternating current is caused to flow therethrough. The antenna 53 may be placed near the window 52 so that the electric field generated from the antenna 53 is efficiently introduced into the processing space 59 via the window 52. The RF power supply 54 that applies an RF voltage is connected to the antenna 53. The matching box 55, which is a matching circuit, is connected in series to an output side of the RF power supply 54. The matching box 55 stabilizes plasma discharge by matching impedances on an input side and the output side.

As illustrated in FIG. 2, the process gas introducer 58 introduces the process gas G2 containing nitrogen gas into the processing space 59. The process gas introducer 58 has a source of the process gas G2 such as a cylinder (not illustrated), a pipe 57, and a gas introduction port 56. The pipe 57 is connected to the source of the process gas G2, passes through the chamber 20 while sealing the chamber 20 in an airtight manner, and extends into the chamber 20. An end portion of the pipe 57 is open as the gas introduction port 56.

The gas introduction port 56 is open at the processing space 59 between the window 52 and the rotary table 31, and introduces the process gas G2. A rare gas may be used as the process gas G2, and the process gas G2 may be argon gas, nitrogen gas, and the like. In addition, for example, the process gas G2 may be supplied at a supply amount that maintains a pressure in the processing space 59 at 5 Pa.

The processing space 59 in which the nitriding process is performed by the nitriding part 50 is partitioned by the inner wall 511. That, the nitriding part 50 has the processing space 59, which is smaller than the chamber 20 and is spaced apart from the processing space 41. Since it is necessary to adjust the pressure in the processing space 59, which is partitioned into a space smaller than the chamber 20, the pressure can be easily adjusted and plasma discharge can be stabilized.

In the nitriding part 50 as described above, an RF voltage is applied to the antenna 53 from the RF power supply 54. Thus, an RF current flows through the antenna 53, and an electric field is generated due to electromagnetic induction. The electric field is generated in the processing space 59 via the window 52, and inductively coupled plasma is generated in the process gas G2. At this time, chemical species of nitrogen containing nitrogen atoms are generated and collide with the film on the workpiece 10, thereby bonding with atoms constituting the film. As a result, the film on the workpiece 10 is nitrided to form a nitride film as a compound film.

As described above, the nitriding part 50 has a function of generating a compound film by plasmarizing nitrogen gas to generate chemical species containing nitrogen atoms and causing a chemical reaction with the film formed on the workpiece 10. In the nitriding part 50, by using inductively coupled plasma with high plasma density, a chemical reaction between chemical species in the plasma and the film formed on the workpiece 10 by the film forming parts 40 is caused efficiently, whereby it is possible to generate a compound film.

[Exhaust Space]

The inner wall 511 is provided in at least one processing unit PU, and the exhaust space 60 is a space that is formed by a double wall constituted by the outer wall 61, which covers the periphery of the inner wall 511 with a gap interposed therebetween and has an opening 61a facing the rotary table 31 in a non-contact manner, and an inner wall 511. An opposite side of the exhaust space 60 to the opening 61a is closed. With this configuration, the process gas G2 leaking from the processing space 59 via the gap between the opening 511a in the inner wall 511 and the rotary table 31 flows into the exhaust space 60 provided on the outer periphery of the inner wall 511.

The outer wall 61 is a U-shaped plate-like body that covers the inner wall 511 in a plan view (see FIG. 1). The outer wall 61 is curved along a surface of the inner wall 511 on a side of the rotary shaft 33 (an opposite side to the side surface 20c), and both ends of the outer wall 61 are in contact with the side surface 20c of the chamber 20. The both ends of the outer wall 61 are opposite ends of the U-shape, that is, two end portions on an opened side in the U-shape. The end portions are end surfaces extending in a vertical direction, that is, in a direction orthogonal to a rotation plane of the rotary table 31 (in a direction parallel to the rotary shaft 33).

In addition, the outer wall 61 covers the inner wall 511 in a side view (see FIG. 2). An end portion of the outer wall 61 on a side of the opening 61a is at the same height position as an end portion of the inner wall 511 on a side of the opening 511a, or at a height position that covers the end portion of the inner wall 511 on the side of the opening 511a. The side of the outer wall 61 opposite to the opening 61a is closed by a plate parallel to the rotation plane of the rotary table 31. However, an upper portion of the outer wall 61 may be closed by the ceiling surface 20a of the chamber 20.

As described above, a space around the inner wall 511 is partitioned by covering the space by the outer wall 61 with a gap interposed therebetween to form the exhaust space 60. In addition, a portion of the inner wall 511 is in contact with the side surface 20c of the chamber 20. By this contact portion, the exhaust space 60 is partitioned over the entire circumference of the inner wall 511 in a plan view. As a result, opposite ends via which the process gas G2 does not circulate around an entire circumference of the inner wall 511 in a plan view are formed in the exhaust space 60. More specifically, the exhaust space 60 having a U-shaped horizontal cross section is formed around the inner wall 511, and the side surface 20c of the chamber 20 serves as the opposite ends of the exhaust space 60.

As illustrated in FIG. 2, a distance d1 between the opening 511a in the inner wall 511 and the rotary table 31 and a distance d2 between the opening 61a of the outer wall 61 and the rotary table 31 are distances that do not inhibit rotation of the rotary table 31. In addition, the end portion of the outer wall 61 facing the rotary table 31 is closer to the rotary table 31 than the end portion of the inner wall 511 facing the rotary table 31. In other words, a lower end (opening 61a) of the outer wall 61 is located closer to the rotary table 31 than a lower end (opening 511a) of the inner wall 511. Without being limited to this, the distance d1 and the distance d2 may be equal to each other.

Figure 4A:
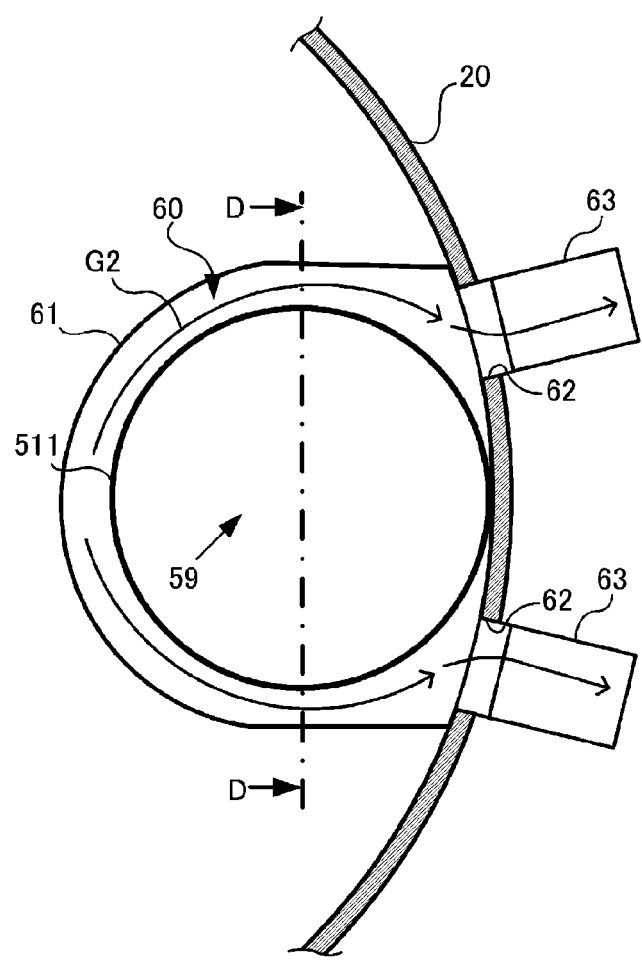
FIGS. 4A and 4B illustrate a nitriding part, where
Figure 4B:
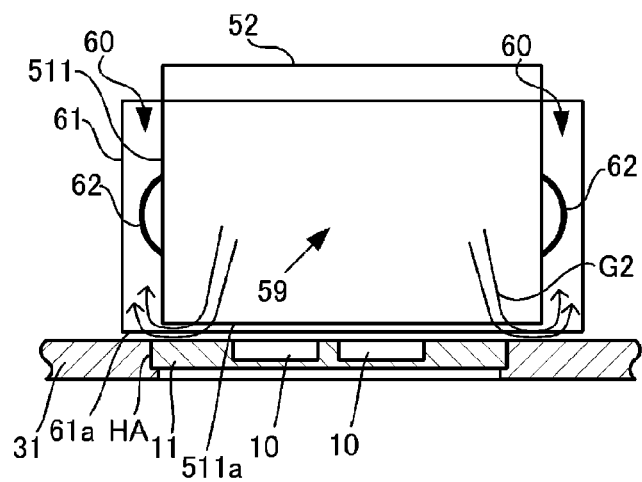

As illustrated in FIG. 4A, exhaust ports 62 are provided in the exhaust space 60. The exhaust ports 62 are in communication with the exhaust space 60, and are connected to exhaust devices 63 that suction the process gas G2 leaking from the gap between the opening 511a of the inner wall 511 and the rotary table 31 and exhausts the process gas G2 to the outside of the chamber 20. As the exhaust devices 63, for example, turbo pumps, which include rotor blades having turbine-type blades and fixed blades and generate an airflow by rotating the rotor blades at a high speed, may be used. A plurality of exhaust ports 62 is provided. The exhaust ports 62 of the present embodiment are formed on both sides of the side surface 20c of the chamber 20 which correspond to the opposite ends of the exhaust space 60. An exhaust flow rate may be, for example, 300 L/min or more. When two exhaust devices 63 are used, each of the exhaust devices 63 may have an exhaust flow rate of 150 L/min or more.

[Surface Processing Part]

The surface processing part 70 processes a surface of the workpiece 10 which is circulated and transferred by the rotary table 31 and a surface of a film deposited by the film forming parts 40. The processing performed by the surface processing part 70 is removing an oxide film from the surface of the workpiece 10 before a film is deposited by the film forming parts 40, and flattening a surface of a film that is being formed on the workpiece 10. The film that is being formed on the workpiece 10 is a film that is being formed on the workpiece 10 until the film reaches a desired thickness.

Specifically, the film that is being formed is a compound film on the workpiece 10 that has been processed by the nitriding part 50 or a film that has been formed on the workpiece 10 by the film forming parts 40. In other words, the transfer part 30 circulates and transfers the workpiece 10 such that the workpiece 10 passes through the film forming parts 40, the nitriding part 50, and the surface processing part 70, whereby the surface processing part 70 emits ions onto the compound film on the workpiece 10 that has been processed by the nitriding part 50. Alternatively, when the film forming parts 40, the surface processing part 70, and the nitriding part 50 are disposed in this order along a transfer direction with respect to the respective parts 40, 50, and 70, the transfer part 30 circulates and transfers the workpiece 10 such that the workpiece 10 passes through the film forming parts 40, the surface processing part 70, and the nitriding part 50, whereby the surface processing part 70 emits ions onto the film formed on the workpiece 10 by the film forming parts 40.

The surface processing part 70 is disposed in a section other than the sections where the film forming parts 40 and the nitriding part 50 are disposed. The surface processing part 70 includes a plasma generator P3 that includes a cylindrical electrode 71, a shield 72, a process gas introducer 75, and an RF power supply 76.

As illustrated in FIGS. 1 and 3, the surface processing part 70 includes the box-shaped cylindrical electrode 71 extending from above the chamber 20 to the interior of the chamber 20. A shape of the cylindrical electrode 71 is not particularly limited, but is substantially fan-shaped in a plan view in the present embodiment. The cylindrical electrode 71 has an opening 71a at a bottom thereof. An outer edge of the opening 71a, i.e., a lower end of the cylindrical electrode 71, faces the top surface of the workpiece 10 on the rotary table 31 with a slight gap therebetween.

The cylindrical electrode 71 has a rectangular cylindrical shape, has the opening 71a at one end, and is closed at the other end. The cylindrical electrode 71 is installed in the opening 21a provided in the ceiling surface 20a of the chamber 20 via an insulator 71c such that the one end thereof having the opening 71a faces the rotary table 31. A side wall of the cylindrical electrode 71 extends into the interior of the chamber 20.

A flange 71b extending outward is provided at the end of the cylindrical electrode 71 opposite to the opening 71a. The insulator 71c is fixed between the flange 71b and a peripheral edge of the opening 21a of the chamber 20 so that the interior of the chamber 20 is maintained airtightly. A material of the insulator 71c is not particularly limited as long as the insulator 71c has insulation property. For example, the insulator 71c may be made of a material such as polytetrafluoroethylene (PTFE).

The opening 71a of the cylindrical electrode 71 is disposed at a position facing the transfer path L of the rotary table 31. The rotary table 31 serves as the transfer part 30 and transfers the tray 11 on which the workpiece 10 is placed to pass through the position facing the opening 71a. In addition, the opening 71a of the cylindrical electrode 71 has a size that accommodates the workpiece 10 placed on the tray 11 in a plan view.

As described above, the cylindrical electrode 71 passes through the opening 21a of the chamber 20, and a portion thereof is exposed to the outside of the chamber 20. The portion of this cylindrical electrode 71 exposed to the outside of the chamber 20 is covered by a housing 71d, as illustrated in FIG. 3. A space inside the chamber 20 is maintained airtightly by the housing 71d. A portion of the cylindrical electrode 71 located inside the chamber 20, that is, a periphery of the side wall of the cylindrical electrode 71 is covered by the shield 72.

The shield 72 is a fan-shaped rectangular cylinder concentric with the cylindrical electrode 71, and is larger in size than the cylindrical electrode 71. The shield 72 is connected to the chamber 20. Specifically, the shield 72 stands upright from the edge of the opening 21a of the chamber 20, and the end portion extending toward the interior of the chamber 20 is located at the same height as the opening 71a of the cylindrical electrode 71. Since the shield 72 acts as a cathode like the chamber 20, the shield 72 may be made of a conductive metal member having a low electrical resistance. The shield 72 may be molded integrally with the chamber 20, or may be installed in the chamber 20 by using a fixing metal member or the like.

The shield 72 is provided to stably generate plasma in the cylindrical electrode 71. Each side wall of the shield 72 is provided to extend substantially parallel to each side wall of the cylindrical electrode 71 with a predetermined gap therebetween. When the gap becomes too large, a capacitance decreases or plasma generated in the cylindrical electrode 71 enters the gap. Thus, the gap may be as small as possible. However, when the gap becomes too small, the capacitance between the cylindrical electrode 71 and the shield 72 increases, which is not preferable. The size of the gap may be appropriately set according to the capacitance required for plasma generation. Although FIG. 3 illustrates only two side wall surfaces extending in a radial direction of the shield 72 and the cylindrical electrode 71, a gap with the same size as the side wall surfaces extending in the radial direction is also provided between two side wall surfaces extending in a circumferential direction of the shield 72 and the cylindrical electrode 71.

In addition, the process gas introducer 75 is connected to the cylindrical electrode 71. In addition to a pipe, the process gas introducer 75 includes a gas source for the process gas G3, a pump, a valve, and the like (not illustrated). The process gas G3 is introduced into the cylindrical electrode 71 by the process gas introducer 75. The process gas G3 may be changed as appropriate according to a purpose of a processing. For example, the process gas G3 may contain oxygen gas or nitrogen gas, oxygen gas or nitrogen gas in addition to an inert gas, or an inert gas such as argon gas.

The RF power supply 76 is connected to the cylindrical electrode 71 to apply an RF voltage. A matching box 77, which is a matching circuit, is connected in series to an output side of the RF power supply 76. The RF power supply 76 is also connected to the chamber 20. When a voltage is applied from the RF power supply 76, the cylindrical electrode 71 acts as an anode, and the chamber 20, the shield 72, the rotary table 31, and the trays 11 act as a cathode, i.e., function as an electrode for reverse sputtering. Therefore, as described above, the rotary table 31 and the trays 11 have conductivity and are in contact with one another to be electrically connected.

The matching box 77 stabilizes discharge of plasma by matching impedances on an input side and an output side. The chamber 20 or the rotary table 31 is grounded. The shield 72 connected to the chamber 20 is also grounded. The RF power supply 76 and the process gas introducer 75 are both connected to the cylindrical electrode 71 via through-holes provided in the housing 71d.

When argon gas, which is the process gas G3, is introduced into the cylindrical electrode 71 from the process gas introducer 75 and the RF voltage is applied to the cylindrical electrode 71 from the RF power supply 76, capacitively coupled plasma is generated, and the argon gas is plasmarized to generate electrons, ions, radicals, and the like. The ions in the generated plasma are emitted onto the film that is being formed on the workpiece 10.

That is, the surface processing part 70 includes the cylindrical electrode 71, which is provided with the opening 71a at one end and into which the process gas G3 is introduced, and the RF power supply 76 which applies the RF voltage to the cylindrical electrode 71. When the transfer part 30 transfers the workpiece 10 to pass directly below the opening 71a, ion irradiation is performed by drawing ions into the film formed on the workpiece 10. In the surface processing part 70, in order to draw ions into the film formed on the workpiece 10, a negative bias voltage is applied to the tray 11 on which the workpiece 10 is placed and the rotary table 31.

By using the cylindrical electrode 71 as in the surface processing part 70, even when an RF voltage is not applied to the tray 11 and the rotary table 31, it is possible to draw ions into the formed thin film by applying a desired negative bias voltage to the tray 11 placing the workpiece 10 thereon and the rotary table 31, which are at the ground potential. With this configuration, since it is not necessary to add a structure for applying an RF voltage to the tray 11 and the rotary table 31 or to consider, for the purpose of obtaining a desired bias voltage, a ratio of an area of an electrode serving as an anode to an area of other members surrounding an electrode serving as a cathode, device design is facilitated.

Therefore, even when the film formation and ion irradiation are repeated while the workpiece 10 is being moved in order to flatten the film that is being formed on the workpiece 10, ions can be drawn into the film formed on the workpiece 10 with a simple structure.

A processing space 74 in which the surface processing is performed by the surface processing part 70 is partitioned by the cylindrical electrode 71. The cylindrical electrode 71 can suppress diffusion of the process gas G3 into the chamber 20. That is, the surface processing part 70 has the processing space 74, which is smaller than the chamber 20 and is spaced apart from the processing spaces 41 and 59. In addition, in the surface processing part 70, the cylindrical electrode 71 may be considered as the inner wall 511. When the outer wall 61 is provided in the surface processing part 70, the outer wall 61 may cover a periphery of the cylindrical electrode 71 with a gap interposed therebetween so that the outer wall 61 is not in contact with the shield 72. In this case, the shield 72 is disposed between the outer wall 61 and the cylindrical electrode 71. Since it is necessary to adjust a pressure in the processing space 74, which is partitioned into a space smaller than the chamber 20, the pressure can be easily adjusted and the plasma discharge can be stabilized. The arrangement order and number of the film forming parts 40, the nitriding part 50, and the surface processing part 70 are not particularly limited.

The surface processing part 70 has a function of flattening a thin film by applying a negative bias voltage to the tray 11 on which a workpiece 10 is placed and the rotary table 31 and drawing ions into the film formed on the workpiece 10. In the surface processing part 70, by using the cylindrical electrode 71, it is possible to simply draw ions into the film formed on the workpiece 10 and to flatten the film.

[Transfer Room]

The transfer room 80 is a container configured to load and unload the workpiece 10 with respect to the chamber 20 via gate valves GV1 and GV2. As illustrated in FIG. 1, the transfer room 80 has an internal space in which the workpiece 10 before being loaded into the chamber 20 is accommodated. The transfer room 80 is connected to the chamber 20 via the gate valve GV1. Although not illustrated, a transfer mechanism configured to load and unload the tray 11 on which the workpiece 10 is placed with respect to the chamber 20 is provided in the internal space of the transfer room 80. The transfer room 80 is depressurized by an exhaust mechanism such as a vacuum pump (not illustrated), and while the chamber 20 is maintained to be vacuum, the transfer mechanism loads a tray 11 on which an unprocessed workpiece 10 is placed into the chamber 20, and unloads a tray 11 on which a processed workpiece 10 is placed from the chamber 20.

A load-locker 81 is connected to the transfer room 80 via the gate valve GV2. The load-locker 81 is a device by which a tray 11 on which an unprocessed workpiece 10 is placed is loaded into the transfer room 80 from the outside and a tray 11 on which a processed workpiece 10 is placed is unloaded from the transfer room 80 by using a transfer mechanism (not illustrated) while the transfer room 80 is maintained to be vacuum. In addition, the load-locker 81 is switched between a vacuum state in which the load-locker 81 is depressurized by an exhaust mechanism such as a vacuum pump (not illustrated) and an atmospheric open state in which the vacuum is broken.

[Cooling Room]

The cooling room 90 cools the workpiece 10 unloaded from the chamber 20. The cooling room 90 includes a container connected to the transfer room 80 and has a cooling mechanism configured to cool the workpiece 10 placed on the tray 11 unloaded from the transfer room 80. As the cooling mechanism, for example, a blower configured to blow a cooling gas may be used. As the cooling gas, for example, Ar gas from the source of the sputtering gas G1 may be used. A cooling temperature may be a temperature that allows transfer in the air, for example, 30 degrees C. In addition, the tray 11, which is disposed in the transfer room 80 and on which the processed workpiece 10 is placed, is loaded into the cooling room 90 by a transfer mechanism (not illustrated).

[Control Device]

The control device 100 controls respective components of the film forming apparatuses 1 such as the exhauster 23, the sputtering gas introducer 49, the process gas introducer 58, the exhaust devices 63 and 73, the power supply 46, the RF power supplies 54 and 76, the motor 32, the exhaust device 63, the transfer room 80, the load-locker 81, and the cooling room 90. The control device 100 is a processing device including a programmable logic controller (PLC) and a central processing unit (CPU), and stores a program describing control contents.

Specifically examples of the control contents may include an initial exhaust pressure of the film forming apparatus 1, powers applied to the targets 42, the antenna 53, and the cylindrical electrode 71, flow rates, introduction times, exhaust flow rates, and exhaust times of the sputtering gas G1 and the process gases G2 and G3, film formation time, surface processing time, a rotation speed of the motor 32, a cooling temperature, a cooling time, and the like. Thus, the control device 100 is capable of dealing with a wide variety of film formation specifications.

[Operations]

Figure 5:
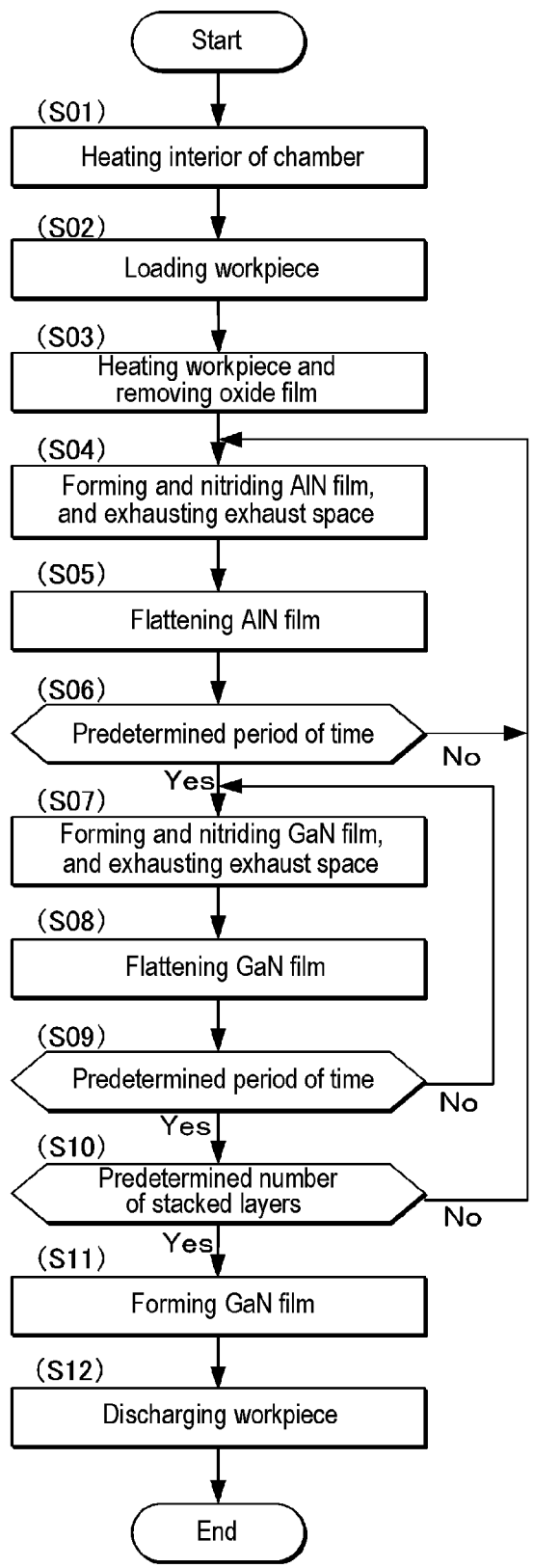
FIG. 5 is a flowchart of processing performed by the film forming apparatus according to the embodiment.

Next, operations of the film forming apparatus 1 controlled by the control device 100 will be explained. A film forming method in which a film is formed by using the film forming apparatus 1 as described below is also one aspect of the present disclosure. FIG. 5 is a flowchart of a film forming process performed by the film forming apparatus 1 of the present embodiment. The film forming process is a process in which AlN films and GaN films are alternately stacked on the workpiece 10, and a GaN layer is further formed. Since a silicon wafer and a sapphire substrate are different in crystal lattice from GaN, there is a problem in that when a GaN film is directly formed thereon, crystallinity of GaN deteriorates. In order to eliminate such crystal lattice mismatch, a buffer layer is formed by alternately stacking AlN films and GaN films, and a GaN layer is formed on the buffer layer. Such a method may be used, for example, when forming a GaN layer on a silicon wafer via a buffer layer in manufacturing a horizontal MOSFET or LED.

First, the interior of the chamber 20 is exhausted from the exhaust port 21 by the exhauster 23, and the pressure in the chamber 20 is always depressurized to a predetermined pressure. In addition, along with the exhaust, the heater starts heating to heat the rotary table 31 (step S01). When the rotary table 31 starts rotating, the entire interior of the chamber 20 is heated by radiation from the heated rotary table 31. By heating along with the exhaust, desorption of residual gases such as water molecules and oxygen molecules in the chamber 20 is promoted. Thus, it becomes difficult for the residual gas to be mixed in as impurities during the film formation, resulting in improvement of crystallinity of the film. After a gas analyzer such as Q-Mass detects that an oxygen concentration in the chamber 20 has fallen to a predetermined value or less, the rotation of the rotary table 31 is stopped.

The trays 11 on which workpieces 10 are placed are loaded into the transfer room 80 via the load-locker 81 and the gate valve GV2 by the transfer mechanism, and are sequentially loaded into the chamber 20 via the gate valve GV1 (step S02). In step S02, the rotary table 31 sequentially moves empty holding areas HA to a loading location of the trays 11 loaded from the transfer room 80. Each of the holding areas HA individually holds a tray 11 loaded by the transfer mechanism. As described above, the trays 11 on which the workpieces 10 are placed are placed in all of the holding areas HA on the rotary table 31.

As the rotary table 31 starts rotating again, the workpieces 10 are heated by the heater, and an oxide film on the surface of each of the workpieces 10 is removed by the surface processing part 70 (step S03). That is, as the rotary table 31 rotates, the workpieces 10 repeatedly pass below the surface processing part 70. In the surface processing part 70, the process gas G3 is introduced into the cylindrical electrode 71 from the process gas introducer 75, and the RF voltage is applied to the cylindrical electrode 71 from the RF power supply 76. The process gas G3 is plasmarized by the application of the RF voltage, and ions in the plasma collide with the surface of the workpiece 10 passing below the opening 71a, thereby removing the oxide film.

Then, a buffer layer is formed by alternately repeating formation of an AlN film by the film forming part 40B and the nitriding part 50 and formation of a GaN film by the film forming part 40A and the nitriding part 50.

First, an AlN film is formed on the workpieces 10 in the film forming part 40B and the nitriding part 50 (step S04). That is, in the film forming part 40B, the sputtering gas introducer 49 supplies the sputtering gas G1 via the gas introduction port 47. The sputtering gas G1 is supplied around the targets 42 made of Al. The power supply 46 applies a voltage to the targets 42. Thus, the sputtering gas G1 is plasmarized. Ions generated by the plasma collide with the targets 42 and beat out sputtered particles containing Al atoms.

When an unprocessed workpiece 10 passes through the film forming part 40B, a thin film on which the sputtered particles containing Al atoms are deposited is formed on the surface of the workpiece 10. In the present embodiment, each time the workpiece passes through the film forming part 40B, a thin film having a thickness in the level of one to two Al atoms is deposited.

The workpiece 10 that has passed through the film forming part 40B by the rotation of the rotary table 31 passes through the nitriding part 50, and in the course of passing through the nitriding part 50, Al atoms in the thin film are nitrided. That is, in the nitriding part 50, the process gas introducer 58 supplies the process gas G2 containing nitrogen gas to the processing space 59, which is interposed between the window 52 and the rotary table 31, via the gas introduction port 56. At the same time, the exhaust device 63 starts exhausting the exhaust space 60. In the processing space 59, a nitrogen atmosphere at a predetermined pressure (e.g., 5 Pa) is formed by supplying the process gas G2. The process gas G2 leaking from the processing space 59 via the gap between the opening 511a in the inner wall 511 and the rotary table 31 is suctioned to flow into the exhaust space 60 and exhausted from the exhaust port 62 by the exhaust device 63. Thus, the process gas G2 is prevented from leaking into the chamber 20 and flowing into the film forming parts 40 and the surface processing part 70.

The RF power supply 54 applies an RF voltage to the antenna 53. An electric field generated by the antenna 53 in which an RF current flows due to the application of the RF voltage reaches the processing space 59 via the window 52. The electric field excites the process gas G2 containing nitrogen gas supplied to the processing space 59 to generate plasma. Nitrogen chemical species generated by the plasma collide with the Al thin film on the workpiece 10 and bond with Al atoms, and the Al atoms are nitrided to form an AlN film.

The workpiece 10, which passes through the nitriding part 50 by the rotation of the rotary table 31 and has the AlN film formed thereon, is directed toward the surface processing part 70, where the AlN film is irradiated with ions (step S05). That is, in the surface processing part 70, the process gas introducer 75 supplies the process gas G3 containing argon gas via a pipe to the processing space 74 inside the cylindrical electrode 71, which is surrounded by the cylindrical electrode 71 and the rotary table 31. When a voltage is applied to the cylindrical electrode 71 by the RF power supply 76, the cylindrical electrode 71 acts as an anode, the chamber 20, the shield 72, the rotary table 31, and the tray 11 act as a cathode, and the process gas G3 supplied to the space inside the cylindrical electrode 71 is excited to generate plasma. Further, argon ions generated by the plasma collide with the AlN film formed on the workpiece 10, so that particles are moved to sparse portions in the film and the film surface is flattened.

As described above, in steps S04 to S05, the film forming process is performed when the workpiece 10 passes through the processing space 41 of the film forming part 40B that is in operation, and the nitriding process is performed when the workpiece 10 passes through the processing space 59 of the nitriding part 50 that is in operation. Then, the AlN film formed on the workpiece 10 is flattened when the workpiece 10 passes through the space in the cylindrical electrode 71 of the surface processing part 70 that is in operation. The term "in operation" has the same meaning as a plasma generation operation of generating plasma being performed in the processing space of each of the parts 40, 50, and 70.

The rotary table 31 continues to rotate until an AlN film having a predetermined thickness is formed on the workpiece 10, i.e., until a predetermined time obtained in advance through simulation or experiment has elapsed (step S06 "No"). In other words, the workpiece 10 continues to circulate between the film forming parts 40 and the nitriding part 50 until the AlN film having predetermined thickness is formed. Since the nitriding process may be performed each time Al is deposited to have a thickness in an atomic level, in order to maintain a balance between the film formation and the nitridation, the rotation speed of the rotary table 31 is set to a relatively slow speed of 50 to 60 rpm.

After the predetermined period of time has elapsed (step S06: "Yes"), the process moves to film formation and nitridation of a GaN film. Specifically, first, the voltage application to the targets 42 by the power supply 46 is stopped, and the operation of the film forming part 40B is stopped.

Next, a GaN film is formed on the workpiece 10 by the film forming part 40A and the nitriding part 50 (step S07).

Then, flattening the GaN film is performed (step S08). That is, in the film forming part 40A, the sputtering gas introducer 49 supplies the sputtering gas G1 around the targets 42 made of Ga and GaN, and the power supply 46 applies a voltage to the targets 42 to plasmarize the sputtering gas G1. Ions generated by the plasma collide with the targets 42 and beat out sputtered particles containing Ga atoms.

Thus, a thin film on which sputtered particles containing Ga atoms are deposited is formed on the surface of the AlN film. In the present embodiment, each time the workpiece 10 passes through the film forming part 40A, a film is deposited to have a thin film thickness in the level of one to two Ga atoms.

The workpiece 10 that has passed through the film forming part 40A by the rotation of the rotary table 31 passes through the nitriding part 50, and in the course of passing through the nitriding part 50, Ga atoms in the thin film are nitrided. That is, in the nitriding part 50, the process gas introducer 58 supplies the process gas G2 containing nitrogen gas to the processing space 59, which is interposed between the window 52 and the rotary table 31, via the gas introduction port 56 to from a nitrogen atmosphere of a predetermined pressure in the processing space 59. At the same time, the exhaust devices 63 start exhausting the exhaust space 60. The process gas G2 leaking from the processing space 59 via the gap between the inner wall 511 and the rotary table 31 is suctioned to flow into the exhaust space 60 and exhausted from the exhaust ports 62 by the exhaust devices 63. Thus, the process gas G2 is prevented from leaking into the chamber 20 and flowing into the film forming parts 40 and the surface processing part 70.

An electric field generated by the antenna 53 in which an RF current flows due to the application of the RF voltage is generated in the processing space 59 via the window 52. In addition, by the electric field, the process gas G2, which contains nitrogen gas and is supplied to the processing space 59, is excited to generate plasma. Nitrogen chemical species generated by the plasma collide with the nitrogen-deficient GaN (non-nitrided state) thin film deposited on the workpiece 10 by sputtering and bond with Ga atoms so that a sufficiently nitrided GaN film is formed.

The workpiece 10, which passes through the nitriding part 50 by the rotation of the rotary table 31 and has the GaN film formed thereon, is directed toward the surface processing part 70, and the GaN film is irradiated with ions in the surface processing part 70 (step S08). When ions collide with the GaN film formed on the workpiece 10, particles are moved to sparse portions in the film and the film surface is flattened.

As described above, in steps S07 to S08, a film forming process of forming the film containing Ga is performed when the workpiece 10 passes through the processing space 41 of the film forming part 40A that is in operation, and a nitriding process is performed when the workpiece 10 passes through the processing space 59 of the nitriding part 50 that is in operation, thereby forming a GaN film. Then, the GaN film formed on the workpiece 10 is flattened when the workpiece 10 passes through the space within the cylindrical electrode 71 of the surface processing part 70 that is in operation.

After a period of time obtained by simulation or experiment as a period of time for a GaN film having a predetermined thickness to be formed on the workpiece 10 has elapsed, the process moves to the formation of the Al film again in order to stack the Al film and the GaN film. That is, after the predetermined period of time has elapsed (step S09: "Yes"), the power supply 46 stops applying the voltage to the targets 42, and the operation of the film forming part 40A is stopped.

The formation of the AlN film and GaN film as described above is repeated until the number of stacked layers reaches a predetermined number (step S10: "No"). When the number of stacked layers reaches the predetermined number (step S10: "Yes"), the formation of the buffer layer is terminated.

In addition, a GaN layer is formed to overlie the buffer layer (step S11). Formation of this GaN layer is performed in the same manner as the formation of the GaN film in the buffer layer described above, but is performed for a period of time that allows this GaN layer to reach a predetermined thickness set for this GaN layer.

After forming the buffer layer and the GaN layer as described above, the tray 11 on which the film-formed workpiece 10 is placed is unloaded into the cooling room 90 via the transfer room 80 by a transfer mechanism. In the cooling room 90, the workpiece 10 is cooled down to a predetermined temperature, and then the workpiece 10 is discharged from the load-locker 81 (step S12).

In the above description, the nitriding part 50 and the surface processing part 70 are continuously operated during the film formation of the buffer layer (steps S04 to S11), but the operation of the nitriding part 50 or the surface processing part 70 may be stopped each time the respective steps S04 to S11 are terminated. In this case, the operation of the nitriding part 50 is stopped after the operation of the film forming part 40B and the operation of the film forming part 40A are stopped. With this configuration, it is possible to sufficiently nitride the surface of the film formed on the workpiece 10 as well, so that an AlN film or GaN film without nitrogen defects can be obtained.

[Effects]
(1) A film forming apparatus 1 of an embodiment includes: a chamber 20 having an interior capable of being evacuated; a rotary table 31 provided in the chamber 20 and configured to rotate to circulate and transfer a workpiece 10 along a circumferential transfer path L; a plurality of processing units PUs configured to perform plasma processing on the workpiece 10 transferred by the rotary table 31 by plasmarizing a reaction gas introduced into the processing units PUs; an inner wall 511 provided in at least one of the processing units PUs to define a processing space 41, into which the reaction gas is introduced to perform the plasma processing in the processing space 41, has and having an opening 511a facing the rotary table 31 in a non-contact manner; an outer wall 61 configured to cover a periphery of the inner wall 511 with a gap interposed between the inner wall 511 and the outer wall 61, and configured to form an exhaust space 60 that has an opening 61a facing the rotary table 31 in a non-contact manner and is closed on a side opposite to the opening 61a; and an exhaust port 62 in communication with the exhaust space 60 and connected to an exhaust device 63 configured to suction the reaction gas leaking from a gap between the opening 511a in the inner wall 511 and the rotary table 31 and exhaust the reaction gas to an outside of the chamber 20.

In addition, at least one of the processing units PUs is a film forming part 40 configured to form a film by depositing a film formation material on the workpiece 10 by sputtering, and both ends of the outer wall 61 are in contact with a side surface 20c of the chamber 20, and a portion of an outer periphery of the inner wall 511 and the side surface 20c of the chamber 20 are partitioned, so that the exhaust space 60 has opposite ends via which the reaction gas does not circulate.

As described above, since the exhaust space 60 along the inner wall 511 is formed between the double wall constituted by the inner wall 511 and the outer wall 61 covering the inner wall 511, the reaction gas leaking from the gap between the inner wall 511 and the rotary table 31 can be directly suctioned and flown into the exhaust space 60 by the exhaust device 63 via the gap between the opening 61a in the outer wall 61 and the rotary table 31, and can be exhausted from the exhaust port 62. That is, by suctioning and exhausting the reaction gas, which leaks from the opening 511a in the inner wall 511, from substantially an entire circumference of the inner wall 511, it is possible to suppress the reaction gas from flowing into the chamber 20. Therefore, it is possible to prevent the reaction gas from entering other processing units PUs in the chamber 20. In particular, by providing the exhaust space 60 with the opposite ends via which the reaction gas does not circulate, a region to be exhausted by the exhaust devices 63 can be suppressed to be within a narrow range, resulting in better exhaust efficiency than that in a case where the opposite ends are in communication with each other.

In addition, when the distance d1 between the opening 511a in the inner wall 511 and the rotary table 31 and the distance d2 between the opening 61a in the outer wall 61 and the rotary table 31, which are illustrated in FIG. 2, are too large, an amount (pressure) of the process gas G2 required for the processing space 59 cannot remain in the processing space 59. In contrast, when the distances d1 and d2 are too small, an end portion of the outer wall 61 facing the rotary table 31 is brought into contact with the rotary table 31, restricting the circulation and transfer by the rotary table 31. Therefore, the distances d1 and d2 are distances that do not restrict rotation of the rotary table 31 while allowing the process gas G2 supplied to the processing space 59 to remain at a predetermined pressure (e.g., 5 Pa) in the processing space 59. Since the process gas G2 leaking from the inner wall 511 is suctioned into the exhaust space 60 adjacent thereto, the process gas G2 does not leak to an outside of the outer wall 61. That is, by setting the supply of the process gas G2 and the suction of the process gas G2 to be balanced with each other to maintain the internal pressure at a predetermined pressure, the distances d1 and d2 can be set to leave an enough margin to avoid the contact.

In addition, the distances d1 and d2 are distances between the inner wall 511 and the rotary table 31 and between the outer wall 61 and the rotary table 31 over the entire circumference. Further, in the present embodiment, since the rotary table 31 and the workpiece 10 are flush with each other, the distances between the inner wall 511 and the rotary table 31 and between the outer wall 61 and the rotary table 31 are the same as the distances between the inner wall 511 and the workpiece 10 and between the outer wall 61 and the workpiece 10. When the workpiece 10 protrudes beyond the rotary table 31, the above-mentioned distances are distances from the workpiece 10.

(2) The end portion of the outer wall 61 facing the rotary table 31 is closer to the rotary table 31 than an end portion of the inner wall 511 facing the rotary table 31. Therefore, the reaction gas leaking from the gap between the inner wall 511 and the rotary table 31 easily flows into the exhaust space 60 and is blocked by the outer wall 61, thereby preventing the reaction gas from leaking to the outside. In addition, even when the rotary table 31 is deformed by heat, leakage of the reaction gas to the outside of the outer wall 61 is prevented.

More specifically, as illustrated in FIG. 2, the distance d2 is smaller than the distance d1. For example, a difference between the distance d1 and the distance d2 may be 5 mm to 1 mm by setting, for example, the distance d1 to be 10 mm or less the distance d2 to be 5 mm or less. When the distance d2 is smaller than the distance d1, a conductance when the reaction gas passes through the distance d2 is smaller than a conductance when the reaction gas passes through the distance d1. Therefore, when d1>d2, the reaction gas is less likely to leak from the outer wall. Therefore, it is possible to set the suction of the reaction gas to be weak. This leads to reduction in amount of the gas supplied to maintain the internal pressure at a predetermined pressure. That is, it is possible to reduce consumption of the gas.

(3) A plurality of exhaust ports 62 is provided. Therefore, exhaust can be performed at high speed by exhaust from a plurality of locations.

(4) The exhaust ports 62 are provided in the side surface 20c of the chamber 20. Therefore, exhaust can be performed via a short path without being hindered by members in the processing unit PU or the rotary table 31.

(5) The exhaust ports 62 are provided at both of the opposite ends of the exhaust space 60, which has a U-shaped horizontal cross section. Therefore, the entire exhaust space 60 can be exhausted from the opposite ends at a high speed.

(6) At least one of the film forming parts 40 has a target 42 made of a film formation material containing GaN, and at least one of the processing units PUs is a nitriding part 50 configured to nitride particles of the film formation material deposited by the film forming part 40 by plasmarizing a reaction gas containing nitrogen introduced into a processing space.

Therefore, by supplying the process gas G2 containing nitrogen to perform a nitriding process in the nitriding part 50, even when a pressure of the process gas G2 in the nitriding part 50 becomes high, the process gas G2 leaking from the processing space 59 via the gap between the inner wall 511 and the rotary table 31 is suctioned into the exhaust space 60 and exhausted from the exhaust ports 62. Thus, the process gas G2 is prevented from flowing into the film forming part 40 and nitriding a surface of the target 42 to turn the surface into an insulator which hinders generation of plasma by discharge. In addition, since the exhaust is not performed directly from the processing space 59 but performed from the exhaust space 60 around an outer periphery of the processing space 59, a pressure in the processing space 59 can be easily maintained.

[Modifications]

The present disclosure is not limited to the above-described embodiment. Although the basic configuration is the same as that of the above-described embodiment, the following modifications are also applicable.

Figure 6B:
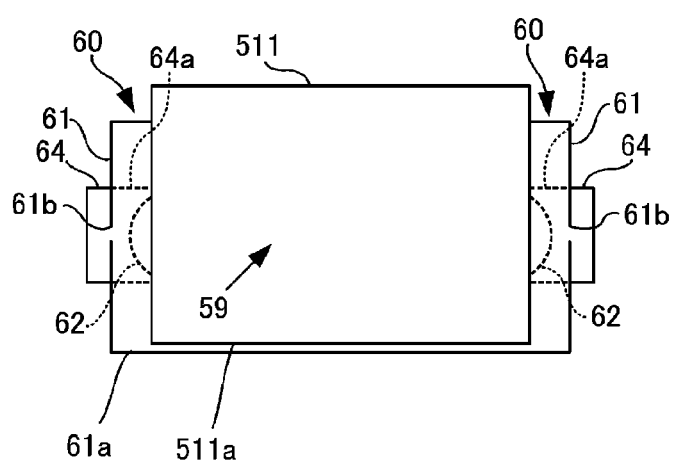

(1) As illustrated in FIGS. 6A and 6B, a plurality of vent holes 61b may be provided in the outer wall 61, and a buffer flow path 64 may be provided around the outer wall 61 to cover the vent holes 61b. The exhaust ports 62 are provided in the buffer flow path 64. As illustrated in FIG. 6A, the buffer flow path 64 is airtightly connected to the exhaust ports 62 via seals 64a. Since the exhaust ports 62 are provided in the buffer flow path 64, the exhaust devices 63 can exhaust the buffer flow path 64 and exhaust the exhaust space 60, which is in communication with the buffer flow path 64 via the vent holes 61b, from the exhaust ports 62. Therefore, the process gas G2 can be uniformly discharged from the outer periphery of the outer wall 61.

Figure 8:
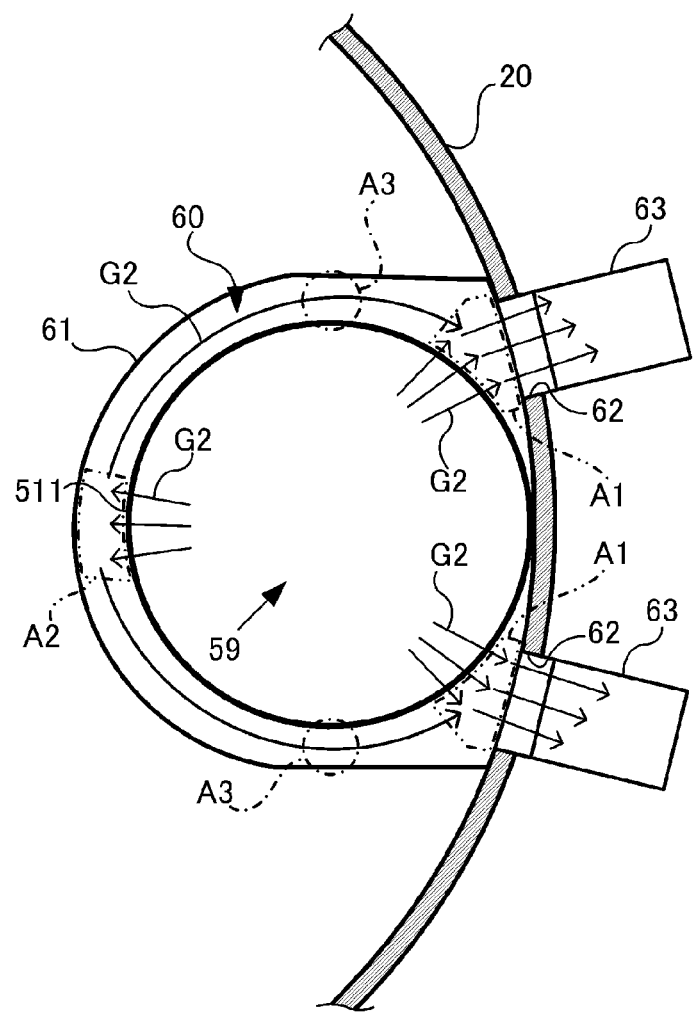
FIG. 8 is a transparent plan view of a nitriding part and illustrates flows of a process gas, which leaks from an inner wall in a region near exhaust ports and in a region far from the exhaust ports, in an exhaust space.

Here, a comparison will be made between areas A1, which are close to the exhaust ports 62 in the exhaust space 60, and an area A2, which is far from the exhaust ports 62 in the exhaust space 60, when there is no buffer flow path 64. As illustrated in FIG. 8, the process gas G2 leaking from the inner wall 511 to the areas A1, which are close to the exhaust ports 62, is immediately exhausted to the outside of the chamber 20 by the exhaust devices 63. In contrast, the process gas G2 leaking from the inner wall 511 to the area A2, which is far from the exhaust ports 62, flows in the exhaust space 60 and reaches the areas A1, which are close to the exhaust ports 62. Therefore, the process gas G2 leaking from the inner wall 511 to the areas A1, which are close to the exhaust ports 62, is more easily exhausted by the exhaust devices 63 than the process gas G2 leaking to the area A2, which is far from the exhaust ports 62. Thus, there is a possibility that distribution of the process gas G2 in the processing space 59 may become non-uniform. When the distribution of the process gas G2 in the processing space 59 becomes non-uniform, a quality of a film formed on the workpiece 10 will also become non-uniform, which is not preferable.

As illustrated in FIGS. 6A and 6B, when the exhaust ports 62 are provided in the buffer flow path 64, the process gas G2 in the exhaust space 60 is exhausted via the vent holes 61b. Therefore, the process gas G2 leaking from the inner wall 511 to the areas A1, which are close to the exhaust ports 62, is difficult to be exhausted by the exhaust devices 63. That is, the buffer flow path 64 plays a role of reducing (alleviating) an exhaust amount of the process gas G2 leaking from the inner wall 511 to the areas A1, which are close to the exhaust ports 62. As a result, an amount of the process gas G2 exhausted in the areas A1, which are close to the exhaust ports 62, and an amount of the process gas G2 exhausted in the area A2, which is far from the exhaust ports 62, become equal to each other, so that the distribution of the process gas G2 in the processing space 59 can be made uniform. Therefore, it is possible to make the quality of the film formed on the workpiece 10 uniform.

In addition, the vent holes 61b may be through-holes. In this case, diameters of the through-holes may be small at locations near the areas A1, which are close to the exhaust ports 62, and may be large at locations near the area A2, which is far from the exhaust ports 62. Alternatively, the though-holes located near the area A2, which is far from the exhaust ports 62, may be larger than the through-holes located near the areas A1, which are close to the exhaust ports 62. In addition, the through-holes may have a slit shape. In this case as well, the through-holes located near the area A2, which is far from the exhaust port 62, may be larger than the through-holes located near the areas A1, which is close to the exhaust ports 62. In addition, as the vent holes 61b, a single through-hole or a slit-like hole may be provided. In this case, the through-hole or the slit-shaped hole may be configured such that a hole diameter increases from the areas A1, which are close to the exhaust ports 62, toward the area A2, which is far from the exhaust ports 62. In addition, as illustrated in this aspect, it is not necessary that the exhaust ports 62 are in direct communication with the exhaust space 60, and the exhaust ports 62 may be in indirect communication with the exhaust space 60.

Figure 9:
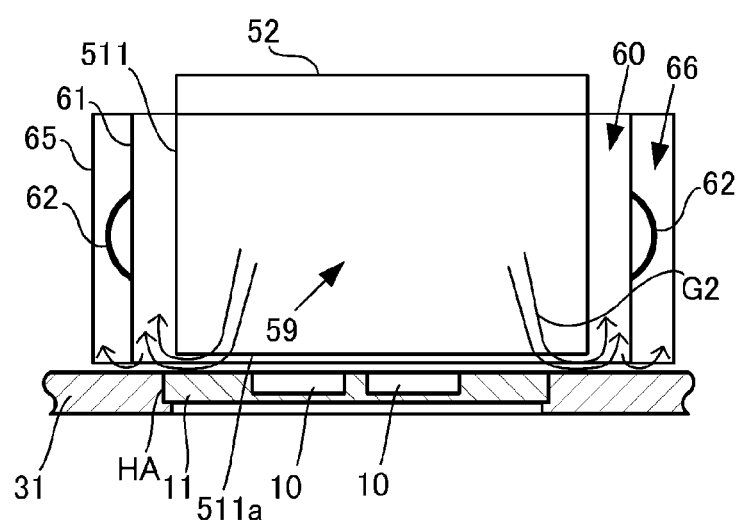
FIG. 9 is a cross-sectional view illustrating a modification in which a buffer space is provided by covering an outer wall with a second outer wall.

For example, as illustrated in FIG. 9, a second outer wall 65 may be provided to cover the outer wall 61, and the exhaust ports 62 may be provided in a buffer space 66 formed by covering the outer wall 61 with the second outer wall 65. In this case as well, the exhaust amount of the process gas G2 leaking from the inner wall 511 to the areas A1, which are close to the exhaust ports 62, can be reduced. In particular, the second outer wall 65 and the buffer space 66 in which the exhaust ports 62 are provided may be provided in the film forming part 40. Since the process gas G2 leaking from the nitriding part 50 can be exhausted in the buffer space 66, the process gas G2 leaking from the nitriding part 50 can be suppressed from entering the film forming part 40.

Figure 10A:
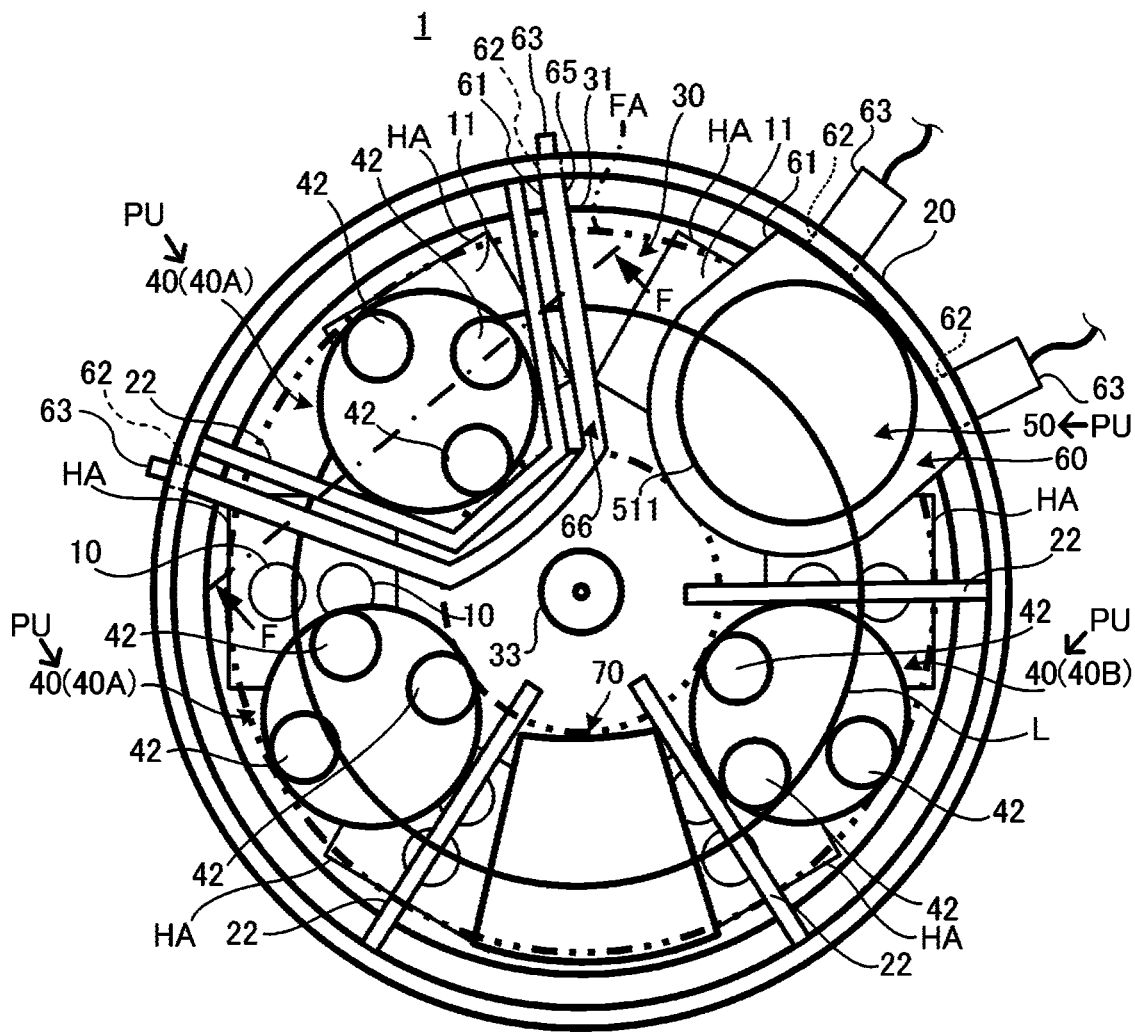
FIGS. 10A and 10B schematically illustrate a configuration of a film forming apparatus according to a modification in which a second outer wall and a buffer space are provided in the film forming part, where
Figure 10B:
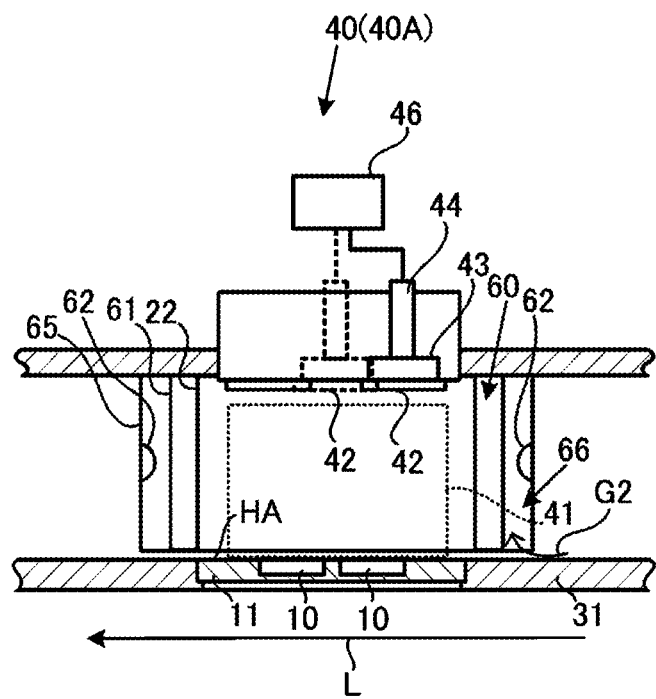

In addition, when the outer wall 61, the second outer wall 65, and the buffer space 66 in which the exhaust ports 62 are provided are provided in the film-forming part 40, the partition 22 has a trapezoidal shape in a plan view, as illustrated in FIG. 10A. That is, in the film forming part 40, the partitions 22 may be considered as the inner wall 511. As illustrated in FIG. 10B, since the process gas G2 leaking from the nitriding part 50 can be exhausted in the buffer space 66, the process gas G2 leaking from the nitriding part 50 can be suppressed from entering the film forming part 40. In addition, when the partitions 22 are rectangular wall plates as illustrated in FIG. 10A, the exhaust space 60 may be formed by considering the outer wall 61 and the second outer wall 65 as the inner wall 511 and the outer wall 61, respectively.

Figure 11B:
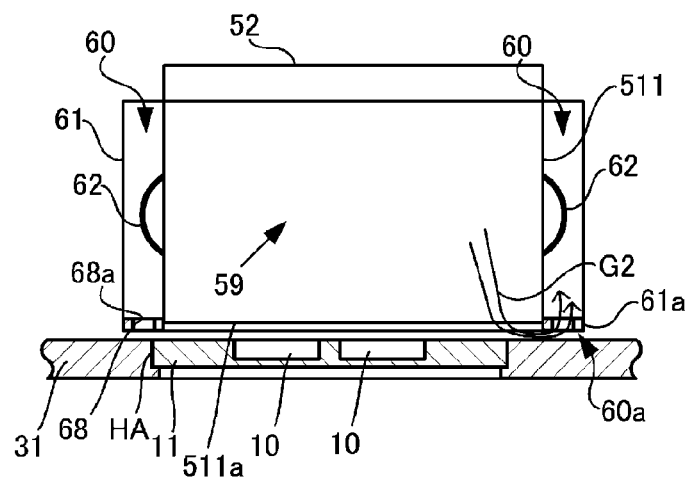

In addition, as illustrated in FIG. 11B, a mask 68 may be provided in an opening 60a of the exhaust space 60, which is formed by the opening 511a in the inner wall 511 and the opening 61a in the outer wall 61. The mask 68 has a plurality of through-holes 68a, as illustrated in FIG. 11A. Diameters of the through-holes 68a may increase from the areas A1, which are close to the exhaust ports 62, toward the area A2, which is far from the exhaust ports 62. With this configuration, it becomes difficult for the process gas G2 leaking from the inner wall 511 to the areas A1, which are close to the exhaust ports 62, to be exhausted by the exhaust devices 63. As a result, the amount of the process gas G2 exhausted in the areas A1, which are close to the exhaust ports 62, and the amount of the process gas G2 exhausted in the area A2, which is far from the exhaust ports 62, may become equal to each other, so that the distribution of the process gas G2 in the processing space 59 can be made uniform.

Figure 12:
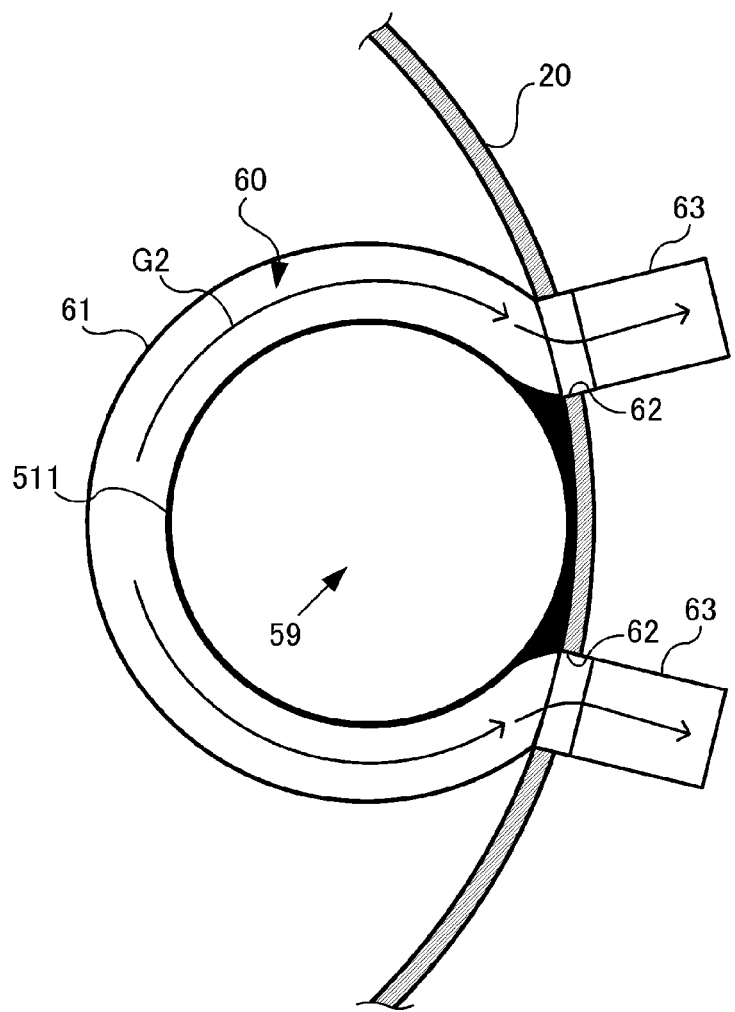
FIG. 12 illustrates a modification in which a shape of an outer wall is the same as a shape of an inner wall, and is a transparent plan view illustrating an aspect of FIG. 4A.

In addition, as illustrated in FIG. 12, the outer wall 61 may have a C-shape in a plan view. In the above-described embodiment, as illustrated in FIG. 8, areas A3 where a distance between the inner wall 511 and the outer wall 61 is narrowed exist between the areas A1, which are close to the exhaust ports 62, and the area A2, which is far from the exhaust ports 62. When the areas A3 with the narrowed distance exist, a conductance decreases in the areas A3, making it difficult for the process gas G2 in the exhaust space 60 to flow. As illustrated in FIG. 12, when the outer wall 61 has a C-shape in a plan view, the distance between the inner wall 511 and the outer wall 61 becomes constant. As a result, since there is no portion in the exhaust space 60 where the conductance becomes small, the process gas G2 in the exhaust space 60 can be easily exhausted to the outside of the chamber 20 by the exhaust devices 63. That is, the outer wall 61 may have the same shape as the inner wall 511.

In addition, like the blackened portion in FIG. 12, a portion where the distance between the inner wall 511 and the outer wall 61 is not constant is generated near the exhaust ports 62. In this case, the mask 68 may be provided in the opening 60a of the exhaust space 60 at a portion corresponding to the blackened portion. With this configuration, the amount of the process gas G2 exhausted in the areas A1, which are close to the exhaust ports 62, and the amount of the process gas G2 exhausted in the area A2, which is far from the exhaust ports 62, may become equal to each other, so that the distribution of the process gas G2 in the processing space 59 can be made uniform.

Figure 13A:
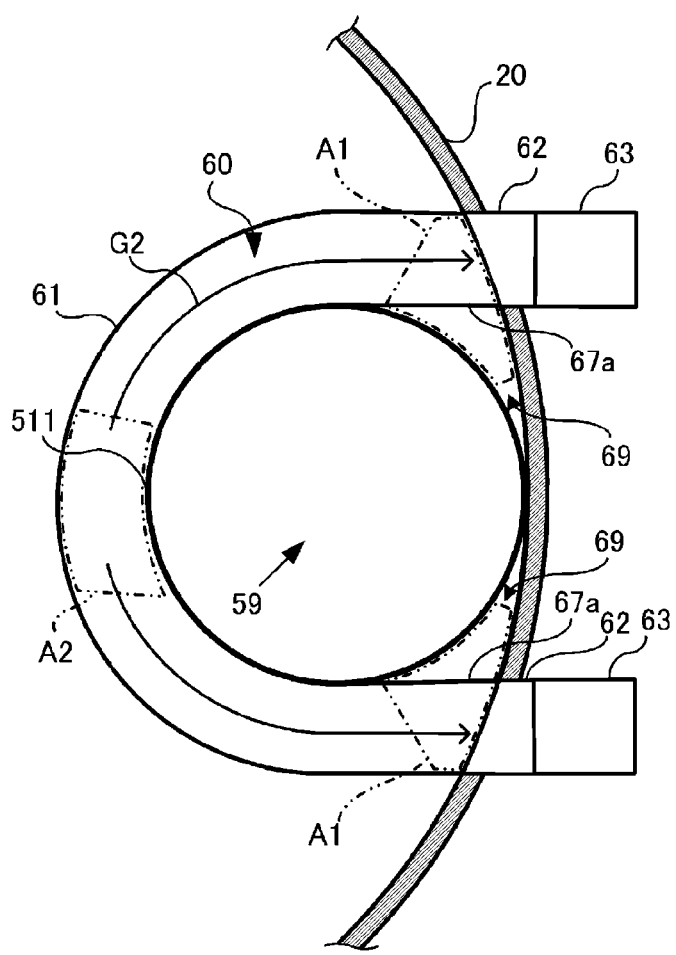
FIGS. 13A and 13B illustrate a modification in which a shape of an inner wall is the same as a shape of an outer wall, where
Figure 13B:
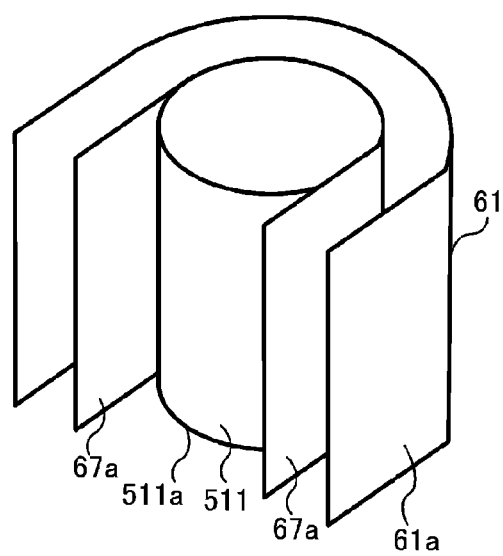

Alternatively, a contour of the inner wall 511 may be the same as a contour of the outer wall 61 so that the distance between the inner wall 511 and the outer wall 61 becomes constant. For example, as illustrated in FIG. 13B, partition plates 67a may be provided in the inner wall 511 such that the distance between the inner wall 511 and the outer wall 61 becomes constant. In FIG. 13B, illustration of the chamber 20, the exhaust ports 62, and the exhaust devices 63 is omitted in order to avoid complication. By providing the partition plates 67a in the inner wall 511, exhaust spaces 69 surrounded by the inner wall 511, the partition plates 67a, and the chamber 20 are formed, as illustrated in FIG. 13A. By forming the exhaust spaces 69, a part of the process gas G2 leaking from the inner wall 511 to the areas A1, which are close to the exhaust ports 62, flows into the exhaust spaces 69. A part of the process gas G2, which has flowed into the exhaust spaces 69, flows into the exhaust space 60 and is then exhausted to the outside of the chamber 20 by the exhaust devices 63. Accordingly, the amount of the process gas G2 exhausted in the areas A1, which are close to the exhaust ports 62, and the amount of the process gas G2 exhausted in the area A2, which is far from the exhaust ports 62, may become equal to each other, so that the distribution of the process gas G2 within the processing space 59 can be made uniform.

Figure 7A:
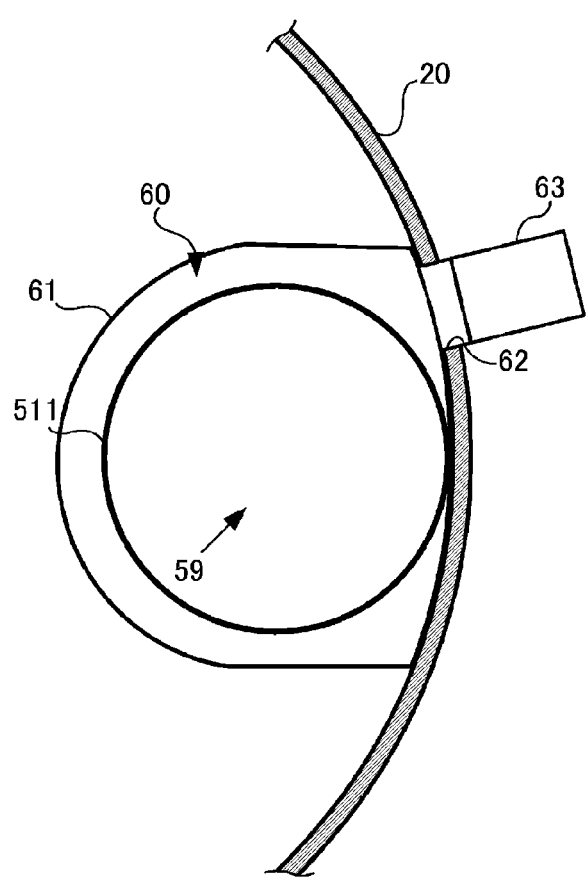
FIGS. 7A and 7B illustrate modifications in which a single exhaust port is provided, where
Figure 7B:
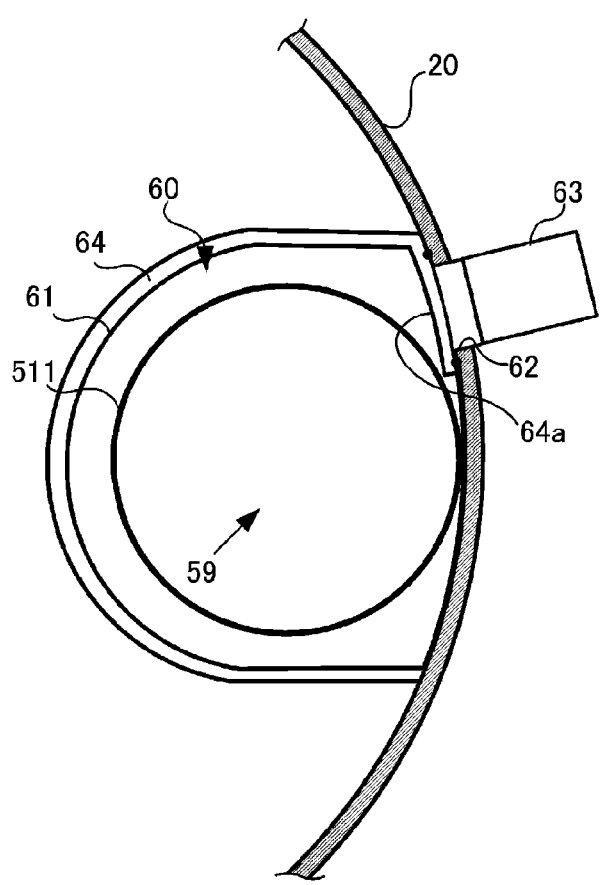

(2) The exhaust port 62 may be provided at least one of the opposite ends of the exhaust space 60. For example, as illustrated in FIG. 7A, the exhaust port 62 may be provided at one end of the exhaust space 60, or as illustrated in FIG. 7B, the exhaust port 62 may be provided at one end of the buffer flow path 64.

Figure 14:
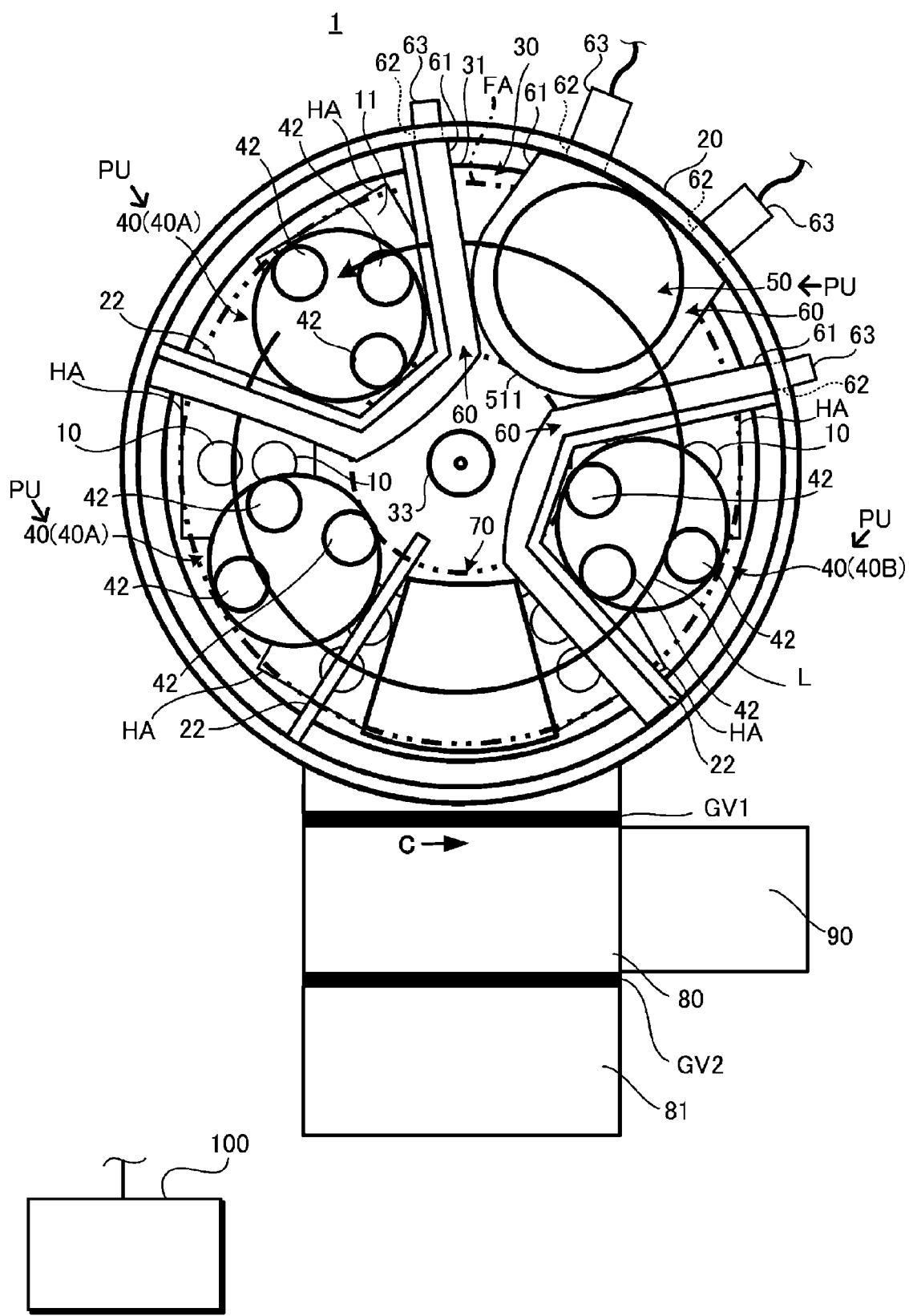
FIG. 14 is a transparent plan view schematically illustrating a configuration of a film forming apparatus according to a modification in which exhaust spaces are provided in two film forming parts adjacent to a nitriding part.

In addition, as illustrated in FIG. 14, when the exhaust space 60 is provided in the film forming part 40 adjacent to the nitriding part 50, the partition 22 may be considered as the inner wall 511, and the outer wall 61 may cover the periphery of the partition 22. In this case, the exhaust port 62 may be provided at one end of the exhaust space 60 near the nitriding part 50. With this configuration, it is possible to further suppress the process gas G2 from mixing into the film forming part 40. The exhaust port 62 (exhaust device 63) may be provided at each of the opposite ends of the exhaust space 60.

Figure 15A:
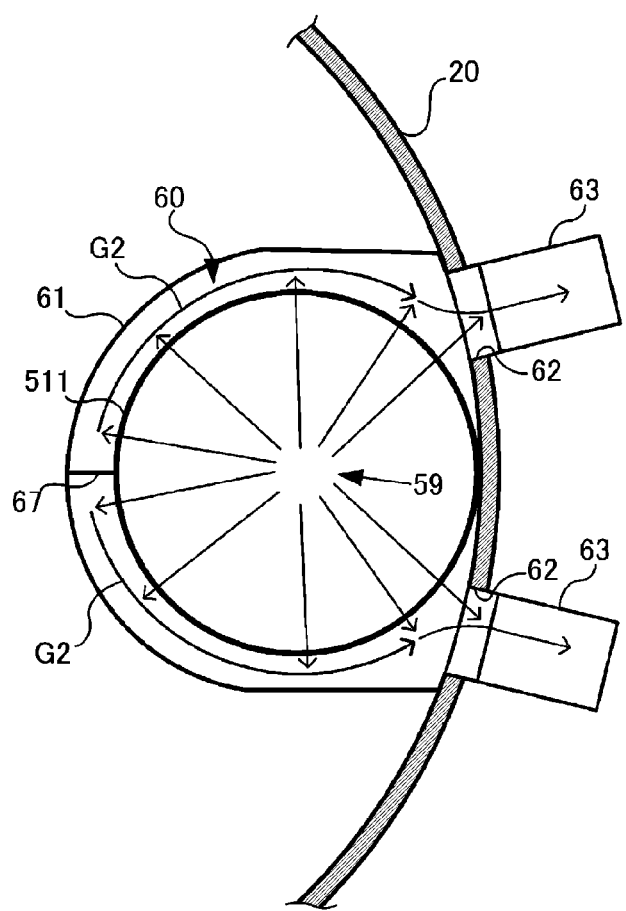
FIGS. 15A and 15B illustrate a modification in which partition plates are provided in an exhaust space, where

(3) A partition plate 67 may be provided in the exhaust space 60 to divide the exhaust space 60 into a plurality of sections, and the exhaust port 62 may be provided in each section. That is, as illustrated in FIG. 15A, at least one partition plate 67 may be provided in the exhaust space 60, and the exhaust ports 62 may be provided in regions continuous to the exhaust space 60. In this case, since the exhaust space 60 can be divided into two sections, a volume of a space to be exhausted via one exhaust port 62 is reduced. As a result, the process gas G2 in the exhaust space 60 can be more easily exhausted. In addition, the partition plate 67 may be connected to the outer wall 61 and/or the inner wall 511.

Figure 15B:
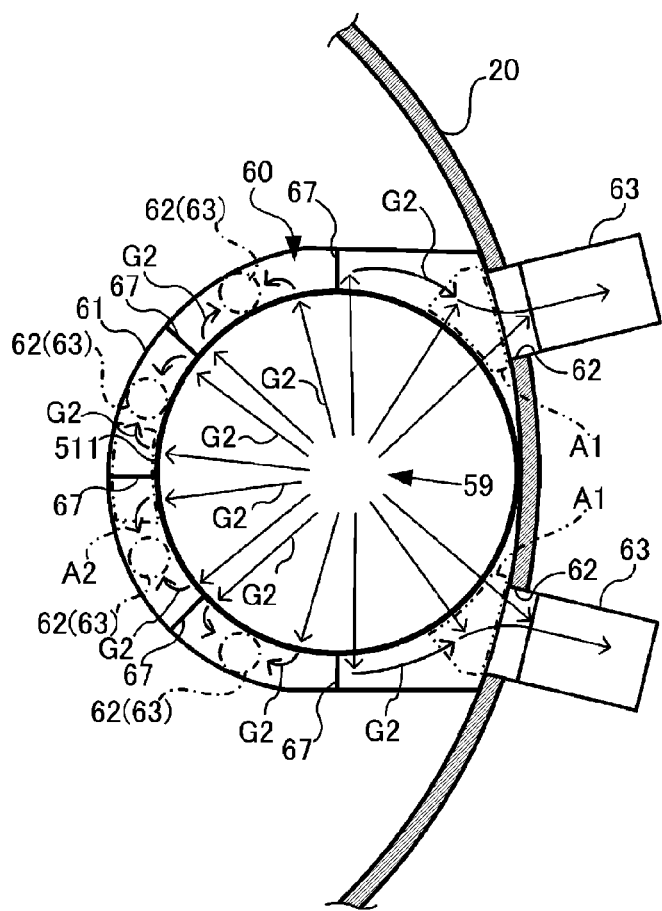

In addition, as illustrated in FIG. 15B, when the interior of the exhaust space 60 is divided into a plurality of sections, the exhaust ports 62 may be located at an upper portion of the exhaust space 60 or in a side surface of the outer wall 61 inside the chamber 20. With this configuration, since the volume of the space exhausted by one exhaust port 62 (exhaust device 63) can be reduced, the process gas G2 in the exhaust space 60 can be more easily exhausted. Further, since the exhaust ports 62 are also provided at locations near the area A2, which is far from the exhaust ports 62, the amount of the process gas G2 exhausted in the areas A1, which are close to the exhaust ports 62, and the amount of the process gas G2 exhausted in the area A2, which is far from the exhaust ports 62, may become equal to each other, so that the distribution of the process gas G2 in the processing space 59 can be made uniform. In addition, it is not necessary that the exhaust devices 63 are directly connected to the exhaust ports 62. The exhaust ports 62 may be connected to the exhaust devices 63 via pipes connected to the exhaust ports 62.

Figure 16:
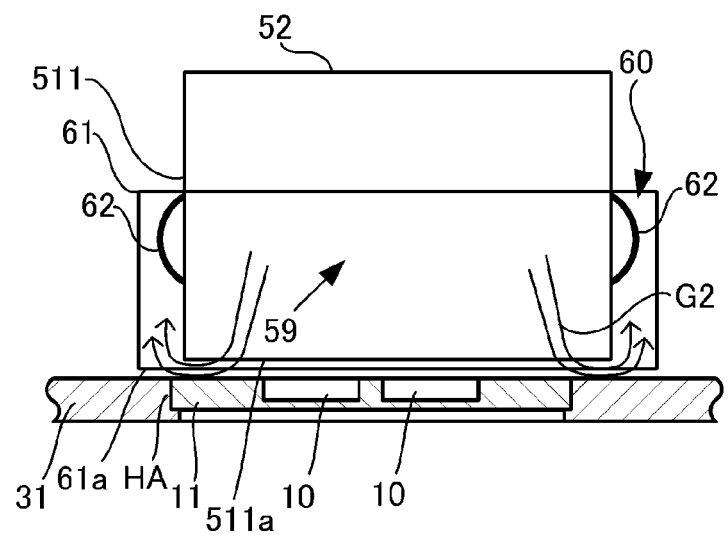
FIG. 16 illustrates a modification in which a height of an outer wall is reduced, and is a transparent plan view illustrating an aspect of FIG. 4B.

In addition, as illustrated in FIG. 16, a height of the exhaust space 60 may be low. For example, a height of a ceiling of the exhaust space 60 may be set to be the same height as upper portions of openings of the exhaust ports 62. With this configuration, it is possible to reduce a volume of the exhaust space 60 so that the process gas G2 in the exhaust space 60 can be more easily exhausted by the exhaust ports 62 (the exhaust devices 63). In addition, when the height of the exhaust space 60 is low, the outer wall 61 may be connected to the inner wall 511. Alternatively, the opening 61a of the outer wall 61 may be supported by a member (not illustrated) that supports the opening 61a from below.

Figure 17:
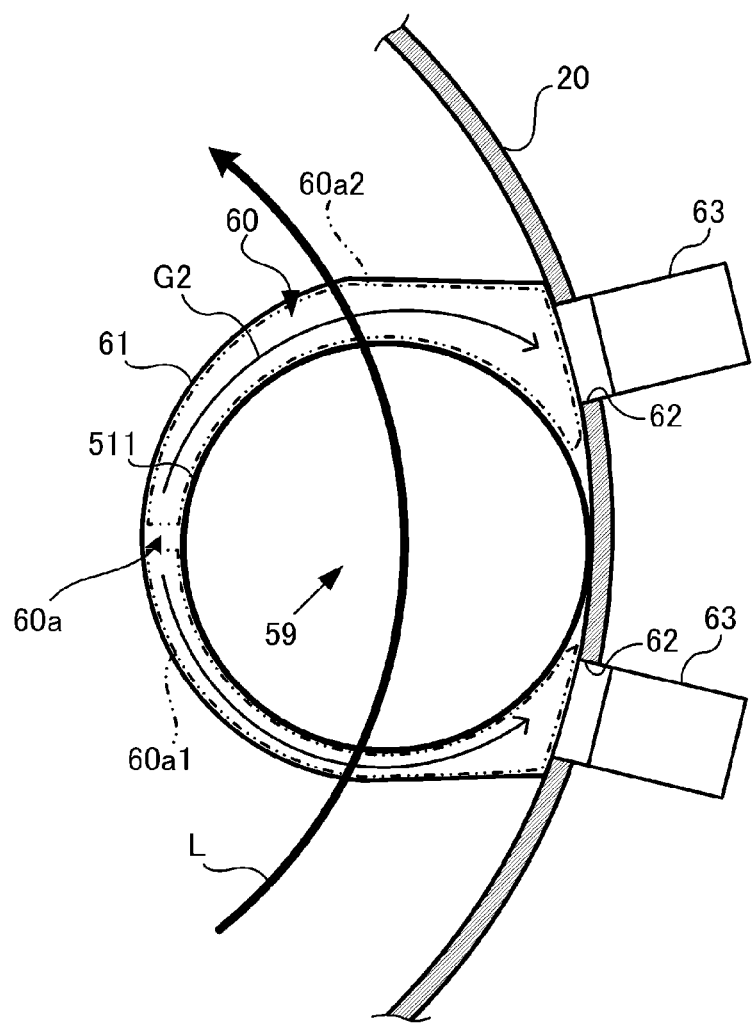
FIG. 17 illustrates a modification in which an opening of an exhaust space has different sizes on upstream and downstream sides of a transfer path, and is a transparent plan view illustrating an aspect of FIG. 4A.

(4) As illustrated in FIG. 17, the opening 60a of the exhaust space 60 may have different sizes on an upstream side and a downstream side of the transfer path L. For example, in the nitriding part 50, since the process gas G2 leaking from the inner wall 511 is affected by the rotation of the rotary table 31, a more amount of the process gas G2 leaks from the exhaust space 60 on the downstream side of the transfer path L than on the upstream side of the transfer path L. Therefore, a size of an opening (downstream-side opening) 60a2 of the exhaust space 60 on the downstream side of the transfer path L is set to be larger than a size of an opening (upstream-side opening) 60a1 of the exhaust space 60 on the upstream side of the transfer path L. By setting the downstream-side opening 60a2 to be larger, a conductance in a rising direction can be increased with respect to the process gas G2 leaking from the inner wall 511. As a result, an amount of rising of the process gas G2 leaking from the inner wall 511 increases and the process gas G2 leaking from the inner wall 511 becomes less likely to leak from the exhaust space 60. Accordingly, it is possible to further suppress the process gas G2 from being mixed into the film forming part 40.

In addition, when the outer wall 61 is provided in the film forming part 40, the opening 61a of the exhaust space 60 on a side adjacent to the nitriding portion 50 may be set to be large. In particular, the film forming part 40 disposed downstream of the nitriding part 50 in the transfer path L may have a large opening 61a on an upstream side.

Figure 18:
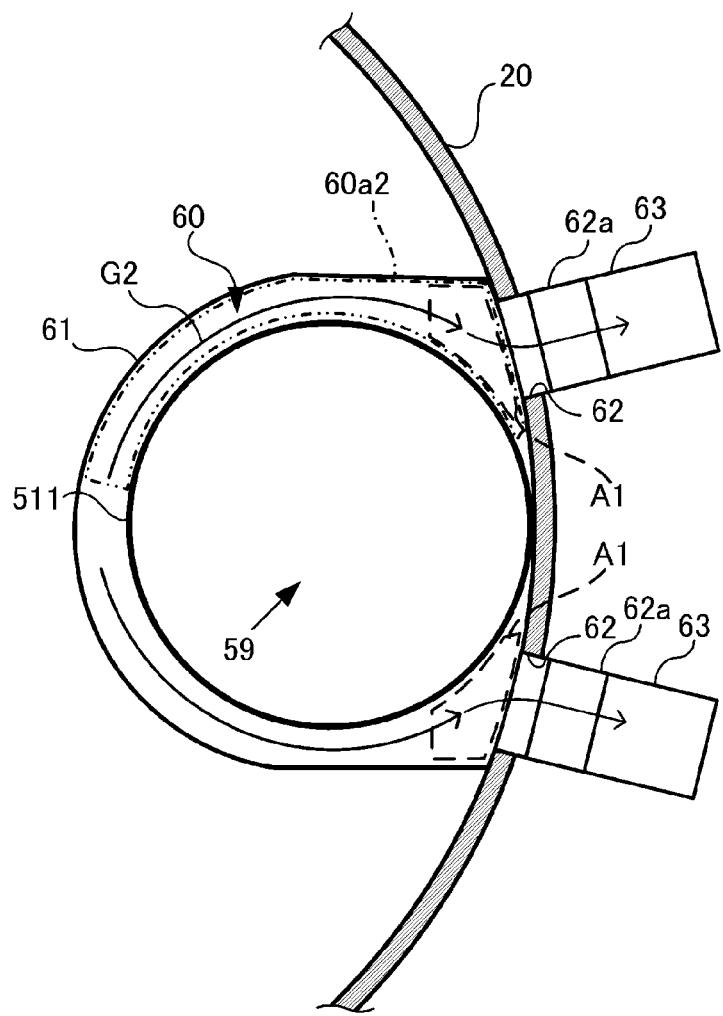
FIG. 18 illustrates a modification in which conductance valves are provided between exhaust ports and exhaust devices, and is a transparent plan view illustrating an aspect of FIG. 4A.

(5) Valves may be provided between the exhaust ports 62 and exhaust devices 63 to adjust an exhaust amount of the reaction gas. For example, as illustrated in FIG. 18, conductance valves 62a may be provided between the exhaust ports 62 and the exhaust devices 63. An exhaust amount in the exhaust space 60 can be adjusted by the conductance valves 62a. As a result, since the amount of process gas G2 leaking from the inner wall 511 can also be adjusted, the pressure in the processing space 59 inside the inner wall 511 can be adjusted. In particular, the exhaust amount in the exhaust space 60 may be reduced by using the conductance valves 62a. With this configuration, the pressure in the processing space 59 can be maintained even with a small flow rate of the process gas G2.

In addition, an open degree of the conductance valve 62a on the downstream side of the transfer path L may be set to be larger than that of the conductance valve 62a on the upstream side of the transfer path L. With this configuration, it is possible to increase the exhaust amount of the downstream-side opening 60a2. Therefore, the process gas G2 is less likely to leak from the downstream-side opening 60a2. Accordingly, it is possible to further suppress the process gas G2 from being mixed into the film forming part 40.

In this case, the amount of the process gas G2 leaking from the inner wall 511 to the areas A1 near the exhaust ports 62 may be reduce by using the mask 68 having the through-holes 68a or the partition plates 67a. In addition, a buffer flow path as illustrated in FIGS. 6A and 6B or a buffer space may also be provided. In addition, a structure in which the distance between the inner wall 511 and the outer wall 61 is constant may be adopted, or the height of the exhaust space 60 may be low. In addition, the opening 60a of the exhaust space 60 may have different sizes on the upstream side and the downstream side of the transfer path L.

(6) In the above-described aspects, the surface processing part 70 is provided in the chamber 20, but a surface processing part may be further provided outside the chamber 20. Like the surface processing part 70, this surface processing part may be provided with a cylindrical electrode 71, an RF power supply 76, and a process gas introducer 75, and may perform, in a stationary state, an oxide film removal process on a workpiece 10 loaded into the surface processing part. In this aspect, during the film forming process on a workpiece 10 inside the chamber 20, the oxide film removal process can be performed on a workpiece 10 which is waiting outside the chamber 20. Thus, a processing time inside the chamber 20 can be shortened. In addition, in a case where flattening the surface of the film, which is being formed on the workpiece 10, is not performed, the film forming apparatus 1 may not include the surface processing part 70 in the chamber 20. In this case, since there is no surface processing part 70, a degree of freedom in design is improved when providing the outer wall 61 in the film forming part 40 and a nitriding part 50, or when providing the buffer flow path 64 or the second outer wall 65 in the outer wall 61. For example, without increasing a footprint of the apparatus, the outer wall 61 may be provided in the film forming part 40 and the nitriding part 50, or the buffer flow path 64 or the second outer wall 65 may be provided in the outer wall 61.

(7) Types and number of the processing units PUs provided in the chamber 20 are not limited to the above-described aspects. For example, the types and numbers of the film forming parts 40, the nitriding part 50, and the surface processing part 70 are not limited to the above-described aspects. The number of the film forming parts 40 may be one, two, or four or more. A plurality of nitriding parts 50 and surface processing parts 70 may be provided. In addition, regarding the film forming part 40, for example, the film forming apparatus 1 may be configured as a film forming apparatus that forms a GaN film by using the film forming part 40A only. Further, in addition to the above-mentioned film forming part 40, a film forming part 40, which differs from the above-mentioned film forming part 40 in terms of a type of target material, a film forming part 40, which is the same as the above-mentioned film forming part 40 in terms of the type of target material, or a nitriding part 50 may be added. Instead of the nitriding part 50, an oxidizing part that oxidizes a material formed on the workpiece 10 may be provided. Furthermore, the film formation material (target) used in a film forming chamber is not limited to GaN or Al, but may be any desired film formation material such as Cu or Si.

(8) The order of arranging the processing units PUs, which perform respective processes such as the film formation, the nitridation, and the surface processing, with respect to a path for circulating and transferring the workpiece 10, i.e., the arrangement order of the processing units Pus, may be set appropriately according to a processing to be applied.

(9) In addition to the above-described aspects, an impurity addition part may be provided to add n-type or p-type impurities (dopants) to a formed GaN film. In this case, the film forming part, the nitriding part, and the impurity addition part are disposed to be arranged in that order on the circulating and transferring path. The impurity addition part have a similar configuration to that of the film forming part 40.

In this aspect, when forming the GaN film, together with the film forming part 40A and the nitriding part 50, the impurity addition part may form a layer including a p-channel (p-type semiconductor) which is obtained by adding Mg ions to the GaN layer. In addition, when forming the GaN film, together with the film forming part 40A and the nitriding part 50, the impurity addition part may form a layer including an n-channel (n-type semiconductor) which is obtained by adding Si ions to the GaN layer.

The n-type impurities or p-type impurities added in the GaN layer by the impurity addition part are not limited to those exemplified above. For example, the n-type impurities may include Ge or Sn. In this case, a film-formation material constituting a target provided in the impurity addition part may be a film formation material containing Ge or Sn instead of Si.

OTHER EMBODIMENTS

According to the embodiments of the present disclosure, it is possible to suppress mixing of reaction gases between processing parts.

While certain embodiments have been described, these embodiments have been presented by way of example only, and are not intended to limit the scope of the disclosures. Indeed, the embodiments described herein may be embodied in a variety of other forms. Furthermore, various omissions, substitutions, combinations, and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A film forming apparatus comprising:
a chamber having an interior capable of being evacuated;
a rotary table provided in the chamber and configured to rotate to circulate and transfer a workpiece along a circumferential transfer path;

a plurality of processing units configured to perform plasma processing on the workpiece transferred by the rotary table by plasmarizing a reaction gas introduced into the processing units;

an inner wall provided in at least one of the processing units to define a processing space, into which the reaction gas is introduced to perform the plasma processing in the processing space, and having an opening facing the rotary table in a non-contact manner;

an outer wall configured to cover a periphery of the inner wall with a gap interposed between the inner wall and the outer wall, and configured to form an opening facing the rotary table in a non-contact manner and an exhaust space that is closed on a side opposite to the opening in the outer wall; and an exhaust port in communication with the exhaust space and connected to an exhaust device configured to suction the reaction gas leaking from a gap between the opening in the inner wall and the rotary table and exhaust the reaction gas to an outside of the chamber, wherein one or more of the processing units is at least one film forming part configured to form a film by depositing a film formation material on the workpiece by sputtering, and wherein both ends of the outer wall are in contact with a side surface of the chamber, and a portion of an outer periphery of the inner wall and the side surface of the chamber are partitioned, so that the exhaust space has opposite ends via which the reaction gas does not circulate.

2. The film forming apparatus of claim 1, wherein an end portion of the outer wall facing the rotary table is closer to the rotary table than an end portion of the inner wall facing the rotary table.

3. The film forming apparatus of claim 1, wherein the exhaust port includes a plurality of exhaust ports.

4. The film forming apparatus of claim 1, wherein the exhaust port is provided in the side surface of the chamber.

5. The film forming apparatus of claim 1, wherein a plurality of vent holes is provided in the outer wall, and
wherein a buffer flow path configured to cover the vent holes is provided around the outer wall.

6. The film forming apparatus of claim 1, wherein the exhaust port is provided at at least one of the opposite ends of the exhaust space.

7. The film forming apparatus of claim 6, wherein a valve is provided between the exhaust device and the exhaust port to adjust an exhaust amount of the reaction gas.

8. The film forming apparatus of claim 1, wherein the exhaust port is provided at each of the opposite ends of the exhaust space.

9. The film forming apparatus of claim 8, wherein a valve is provided between the exhaust device and the exhaust port to adjust an exhaust amount of the reaction gas.

10. The film forming apparatus of claim 1, wherein the at least one film forming part is a single film forming part,
wherein the single film forming part has a target made of a film formation material containing GaN, and
wherein at least one of the processing units is a nitriding part configured to nitride particles of the film formation material deposited by the film forming part by plasmarizing a process gas, which contains nitrogen and is introduced into the processing space.

11. The film forming apparatus of claim 1, wherein the at least one film forming part includes a plurality of film forming parts,
wherein at least one of the plurality of film forming parts has a target made of a film formation material containing GaN, and
wherein at least one of the processing units is a nitriding part configured to nitride particles of the film formation material deposited by the film forming part by plasmarizing a process gas, which contains nitrogen and is introduced into the processing space.

* * * * *